(12) United States Patent
Frost

(10) Patent No.: US 12,575,076 B2
(45) Date of Patent: Mar. 10, 2026

(54) THREE-DIMENSIONAL FOLDED STATIC RANDOM-ACCESS MEMORY

(71) Applicant: Intel Corporation, Santa Clara, CA (US)

(72) Inventor: Denzil Frost, Rio Rancho, ID (US)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 18/319,717

(22) Filed: May 18, 2023

(65) Prior Publication Data

US 2024/0389294 A1     Nov. 21, 2024

(51) Int. Cl.
H10B 10/00     (2023.01)

(52) U.S. Cl.
CPC ................................. H10B 10/125 (2023.02)

(58) Field of Classification Search
CPC ....... H10B 10/125; H10B 10/12; H10D 89/10
See application file for complete search history.

(56) References Cited

U.S. PATENT DOCUMENTS

| | | | |
|---|---|---|---|
| 7,092,288 B2 | 8/2006 | Lojek | |
| 7,368,788 B2 * | 5/2008 | Huo ........................ | H10D 86/01 |
| | | | 257/350 |
| 7,701,751 B2 | 4/2010 | Kang et al. | |
| 7,804,702 B2 | 9/2010 | Madan | |
| 8,178,862 B2 | 5/2012 | Colinge | |
| 11,087,832 B1 | 8/2021 | Gomes et al. | |
| 11,158,368 B2 * | 10/2021 | Vincent .................. | H10B 10/12 |
| 11,335,686 B2 | 5/2022 | Gomes et al. | |
| 2002/0036313 A1 | 3/2002 | Yang et al. | |
| 2005/0184292 A1 | 8/2005 | Kwak et al. | |
| 2010/0295102 A1 | 11/2010 | Sankin et al. | |
| 2015/0035568 A1 | 2/2015 | Peng et al. | |
| 2015/0162336 A1 | 6/2015 | Kim et al. | |
| 2016/0197069 A1 | 7/2016 | Morrow et al. | |

(Continued)

FOREIGN PATENT DOCUMENTS

| | | |
|---|---|---|
| CN | 116133359 A | 5/2023 |
| EP | 3534401 A2 | 9/2019 |

(Continued)

OTHER PUBLICATIONS

Anil, D.G., et al., "Performance Evaluation of Ternary Computation in SRAM Design Using Graphene Nanoribbon Field Effect Transistors," IEEE 8th Annual Computing and Communication Workshop and Conference (CCWC), Las Vegas, NV, pp. 382-388 (2018).

(Continued)

*Primary Examiner* — Allison Bernstein
(74) *Attorney, Agent, or Firm* — Akona IP PC

(57) ABSTRACT

Described herein are SRAM cells in which some transistors are implemented as thin film transistors (TFTs) while other transistors are implemented as non-TFTs (e.g., as FinFETs or nanoribbon-based transistors), where the TFTs are folded over non-TFTs to realize high-density 3D SRAM. For a given SRAM cell, either N-type transistors may be implemented as TFTs and stacked above P-type transistors that are implemented as non-TFTs, or P-type transistors may be implemented as TFTs and may be stacked above N-type transistors that are implemented as non-TFTs.

24 Claims, 11 Drawing Sheets

(56) References Cited

U.S. PATENT DOCUMENTS

| | | | |
|---|---|---|---|
| 2017/0256480 A1 | 9/2017 | Reingruber et al. | |
| 2017/0287905 A1 | 10/2017 | Morrow et al. | |
| 2018/0323199 A1 | 11/2018 | Roberts et al. | |
| 2019/0103406 A1 | 4/2019 | Tang et al. | |
| 2019/0287908 A1 | 9/2019 | Dogiamis et al. | |
| 2019/0305135 A1 | 10/2019 | Radosavljevic et al. | |
| 2020/0105719 A1 | 4/2020 | Li et al. | |
| 2020/0111918 A1 | 4/2020 | Karda et al. | |
| 2020/0127142 A1 | 4/2020 | Dewey et al. | |
| 2020/0411078 A1 | 12/2020 | Sharma et al. | |
| 2020/0411524 A1 | 12/2020 | Arslan et al. | |
| 2021/0098062 A1 | 4/2021 | Kwon | |
| 2021/0193666 A1 | 6/2021 | Gomes et al. | |
| 2021/0272624 A1 | 9/2021 | Gomes et al. | |
| 2022/0208258 A1* | 6/2022 | Zhu | G11C 11/412 |
| 2022/0285368 A1 | 9/2022 | Fackenthal | |
| 2024/0284653 A1* | 8/2024 | Lin | H10D 89/10 |

FOREIGN PATENT DOCUMENTS

| | | | |
|---|---|---|---|
| JP | 2006203250 A | 8/2006 | |
| JP | 2014222740 A | 11/2014 | |
| TW | 202119594 | 5/2021 | |
| WO | 2018208719 A1 | 11/2018 | |

OTHER PUBLICATIONS

Hsieh, E.R., et al., "A Novel Architecture to Build Ideal-linearity Neuromorphic Synapses on a Pure Logic FinFET Platform Featuring 2.5ns PGM-time and 1012 Endurance," 2019 Symposium on VLSI Technology Digest of Technical Papers; 2 pages.

Joshi, S., et al., "Graphene Nanoribbon Field Effect Transistor Based Ultra-Low Energy SRAM Design," IEEE International Symposium on Nanoelectronic and Information Systems (iNIS), Gwalior, pp. 76-79 (2016).

Khasanvis, S., et al., "Low-Power Heterogeneous Graphene Nanoribbon-CMOS Multistate Volatile Memory Circuit," 17 pages.

Rabieefar, et al., "Utilizing Graphene Nano-Ribbon Transistor in Data Converters: A Comparative Study," ECS Journal of Solid State Science and Technology, 8; M30-M37 (2019).

Schuddinick, R.J et al "The Complementary FET (CFET) for CMOS scaling beyond N3", 2018 Symposium on VLSI Technology Digest of Technical Papers, Jun. 18-22, 2018, pp. 141-142.

Trombini, H., et al., "Unraveling structural and compositional information in 3D FinFET electronic devices," Nature.com/Scientific Reports; 7 pages (Aug. 12, 2019).

Xu, C., et al., "Modeling, Analysis, and Design of Graphene Nano-Ribbon Interconnects," IEEE Transaction on Electron Devices; vol. 56, No. 8; pp. 1567-1578 (Aug. 2009).

* cited by examiner

THREE-DIMENSIONAL FOLDED STATIC RANDOM-ACCESS MEMORY

BACKGROUND

Embedded memory is important to the performance of modern system-on-a-chip (SoC) technology. Static random-access memory (SRAM) is one example that may be implemented as embedded memory, particularly suitable for modern SoC due to its compatibility with fabrication processes used to manufacture computing logic, e.g., front end of line (FEOL) processes. In some deployment scenarios, SRAM may have advantages over other types of memory, such as dynamic random-access memory (DRAM). However, for some applications demanding large on-die cache, such as tens of megabytes (MBs) for handling memory bandwidth, the area and standby power of an SRAM-based cache in an integrated circuit (IC) device may pose significant challenges to SoC design.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
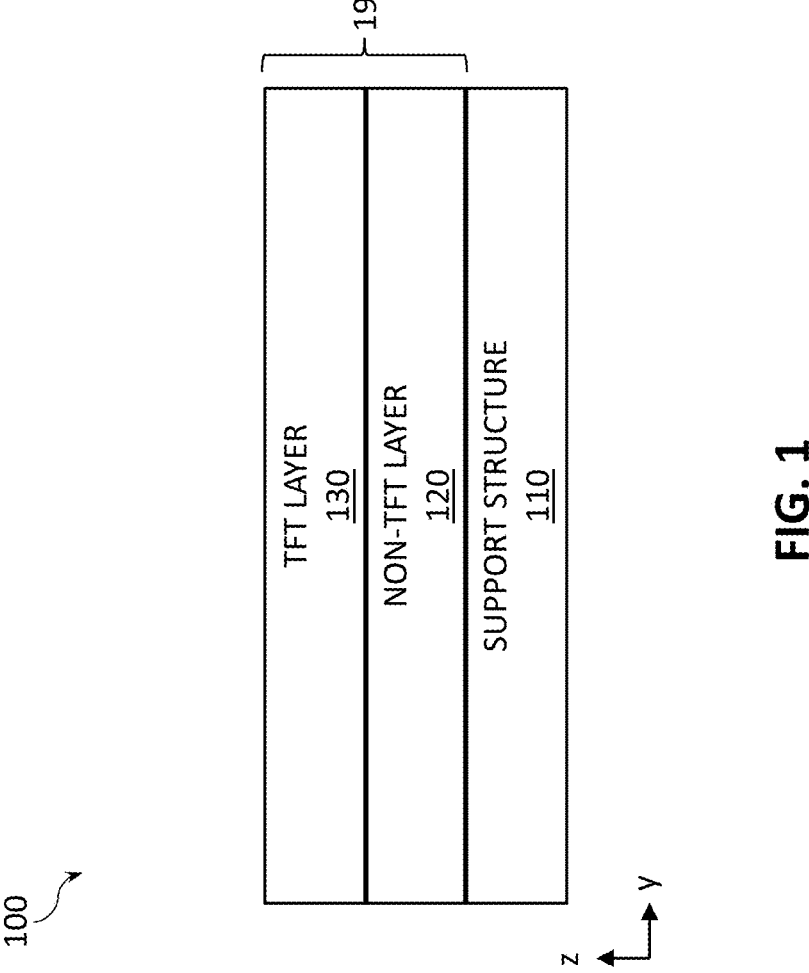
FIG. 1 provides a schematic illustration of an IC device in which three-dimensional (3D) folded SRAM may be implemented, according to some embodiments of the present disclosure.

Disclosed herein are 3D folded SRAM cells, and related methods and devices. The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating 3D folded SRAM cells and associated arrangements and devices (e.g., IC arrangements and devices implementing one or more 3D folded SRAM cells) as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each IC component becomes increasingly significant. Careful design of SRAM may help with such an optimization.

An SRAM cell includes a plurality of transistors for storing a bit value or a memory state (e.g., logic "1" or "0") of the cell, and one or more access transistors for controlling access to the cell (e.g., access to write information to the cell or access to read information from the cell). An example SRAM cell may be made up of six transistors and is, therefore, may be referred to as a "6T SRAM cell," where four transistors are used to store a bit value and two transistors are access transistors, coupled to a bitline (BL) and a wordline (WL). In such an SRAM cell, four of the transistors are transistors of a first type and two of the transistors of a second type, where the type of a transistor is defined in terms of majority carriers in a transistor: N-type transistors (e.g., N-type metal-oxide-semiconductor (NMOS) transistors) have electrons as majority carrier and P-type transistors (e.g., P-type metal-oxide-semiconductor (PMOS) transistors) have holes as majority carrier. Thus, in some embodiments of a 6T SRAM cell, four of transistors May be N-type transistors while two of the transistors are P-type transistors, and, in other embodiments of a 6T SRAM cell, four of transistors May be P-type transistors while two of the transistors are N-type transistors.

Conventionally, SRAM cells have been implemented with all transistors being FEOL, logic-process based, transistors implemented in an upper-most layer of a semiconductor substrate (such FEOL transistors are sometimes referred to as frontend transistors). However, using conventional FEOL transistors creates several challenges for increasing memory density. One challenge resides in that, given a usable surface area of a substrate, there are only so many FEOL transistors that can be formed in that area, placing a significant limitation on the density of SRAM cells. In conventional solutions, attempts to increase SRAM density have included decreasing the critical dimensions of SRAM cells, which requires ever-increasing process complexity and cost, resulting in diminishing returns and expected slow pace of SRAM scaling for future nodes. Another challenge relates to leakage of access transistors implemented as FEOL transistors, where leakage refers to current flowing between the source and the drain of a transistor when the transistor is supposed to be in an "off" state. Reducing leakage of FEOL transistors in the scaled technology is difficult and, therefore, implementing SRAM with all transistors being FEOL transistors is challenging in advanced technology nodes (e.g., 10 nanometer, 7 nanometer, 5 nanometer, and beyond).

Embodiments of the present disclosure may improve on at least some of the challenges and issues described above by designing SRAM to be a 3D folded SRAM where, for a given SRAM cell, some of the transistors are implemented as thin film transistors (TFTs) while others are implemented as non-TFTs (e.g., as FinFETs or nanoribbon-based transistors), where the TFTs are vertically-stacked (i.e., folded) over non-TFTs. A TFT is a special kind of transistor made by depositing a thin film of an active semiconductor material over a supporting layer that may be an insulator layer. At least a portion of the active semiconductor material forms a channel portion (which may also be referred to as a "channel region") of the TFT. This is different from conventional, non-TFT, transistors (e.g., FEOL transistors) where the active semiconductor channel material is typically a part of a semiconductor substrate, e.g., a part of a silicon wafer. In particular, embodiments of the present disclosure are based on recognition that, for a given SRAM cell, either N-type transistors may be implemented as TFTs and stacked above (i.e., folded over) P-type transistors that are implemented as non-TFTs, or P-type transistors may be implemented as TFTs and may be stacked above (i.e., folded over) N-type transistors that are implemented as non-TFTs. Such designs are referred to herein as "3D folded SRAM." In the context of the present disclosure, the term "above" may refer to being further away from a support structure (e.g., a substrate, a wafer, a die, or a chip) over which 3D folded SRAM is provided, while the term "below" refers to being closer to the support structure.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. In some embodiments, 3D folded SRAM cells as described herein may be implemented as embedded SRAM.

Using TFTs to realize 3D folded SRAM designs described herein may provide several advantages and enable unique architectures that were not possible with conventional FEOL logic transistors.

One advantage is that TFTs may be moved to the back end of line (BEOL) layers (also referred to as "backend") of an advanced complementary metal-oxide-semiconductor (CMOS) process, thus enabling a stacked architecture to realize high-density 3D SRAM. In particular, incorporating sets of transistors of a given SRAM cell in different layers above the substrate may allow significantly increasing density of SRAM cells in a memory array having a given footprint area (the footprint area being defined as an area in a plane of the support structure, or a plane parallel to the plane of the support structure, i.e., the x-y plane of an example coordinate system shown in the drawings of the present disclosure), or, conversely, may allow significantly reducing the footprint area of a structure with a given density of SRAM cells.

Furthermore, by implementing the TFTs of SRAM cells in the upper metal layers of a metallization stack of an IC device (i.e., in layers away from the support structure), more area becomes available in the FEOL, which may allow implementing other circuits in the FEOL, e.g., peripheral circuits that control memory operation, logic circuits, or other types of memory. Thus, moving some of the transistors of SRAM cells to the BEOL layers may ease integration challenges introduced by the desire to realize embedded SRAM arrays. As used herein, the term "metal layer" may refer to a layer above a support structure that includes electrically conductive interconnects (e.g., conductive lines and conductive vias) for providing electrical connectivity between different IC components. Metal layers described herein may also be referred to as "interconnect layers" to clearly indicate that these layers include electrically conductive interconnects which may, but does not have to, be metal.

Yet another advantage of using TFTs to realize 3D folded SRAM designs as described herein may be based on the fact that, in some respects, TFTs may have improved performance compared to conventional FEOL transistors (e.g., TFTs may have lower leakage), allowing to relax the demands on other parameters of SRAM cells. Still further, 3D folded SRAM designs described herein may be realized using fewer masks and at a lower cost, compared to existing SRAM.

As the foregoing illustrates, 3D folded SRAM as described herein may be used to address the scaling challenges of conventional SRAM technology and enable high-density embedded SRAM compatible with advanced CMOS processes. Other technical effects will be evident from various embodiments described here.

Various IC devices with 3D folded SRAM cells as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "read" and "write" memory access/operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. Although certain elements may be referred to in the singular herein, such elements may include multiple sub-elements. For example, "an insulator material" may include one or more insulator materials. The term "insulating" and variations thereof (e.g., "insulative" or "insulator") means "electrically insulating," the term "conducting" and variations thereof (e.g., "conductive" or "conductor") means "electrically conducting," unless otherwise specified. For example, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. With reference to optical signals and/or devices, components and elements that operate on or using optical signals, the term "conducting" can also mean "optically conducting."

In the following, some descriptions may refer to a particular source/drain (S/D) region (also sometimes referred to as a "diffusion region") or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed. Furthermore, although descriptions of the present disclosure may refer to certain transistors of SRAM cells or logic devices provided in a given layer, each layer of the IC devices described herein may also include other types of devices. For example, in some embodiments, layers of IC devices in which non-TFTs of 3D folded SRAM cells are implemented may also include logic devices (e.g., logic transistors) or other types of memory cells (e.g., DRAM cells) or TFTs. In another examples, in some embodiments, layers of IC devices in which TFTs of 3D folded SRAM cells are implemented may also include other types of memory cells (e.g., DRAM cells) or non-TFTs (e.g., transistors provided by substrate bonding or layer transfer).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Any of the features discussed with reference to any of accompanying drawings herein may be combined with any other features to form IC devices with 3D folded SRAM cells, as appropriate. A number of elements of the drawings are shared with others of the drawings; for ease of discussion, a description of these elements is not repeated, and these elements may take the form of any of the embodiments disclosed herein. If multiple instances of certain elements are illustrated, then, in some cases, to not clutter the drawings only some of these elements may be labeled with a reference sign and other ones of these elements are not labeled. However, in other cases, for ease of explanation, different instances of a given element in a single drawing may be referred to with numbers 1, 2, and so on, after a dash (e.g., for example, some of the drawings illustrate two S/D regions 204, labeled individually as an S/D region 204-1 and an S/D region 204-2). For convenience, if a collection of drawings designated with different letters are present, e.g., FIGS. 2A-2D, such a collection may be referred to herein without the letters, e.g., as "FIG. 2."

The drawings are not necessarily to scale. Although many of the drawings illustrate rectilinear structures with flat walls and right-angle corners, this is simply for ease of illustration and may not reflect real-life process limitations which may cause various features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used to describe a range of dimensions, the phrase "between X and Y" represents a range that includes X and Y. When used to describe a location of an element, the phrase "between X and Y" represents a region that is spatially between element X and element Y. The description may use the phrases "in an embodiment" or "in embodiments," which may each refer to one or more of the same or different embodiments. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−20%, e.g., within +/−5% or within +/−2%, of a target value based on the context of a particular value as described herein or as known in the art.

FIG. 1 provides a schematic illustration of a cross-sectional view of an example IC device 100 in which 3D folded SRAM may be implemented, according to some embodiments of the present disclosure. As shown in FIG. 1, in general, the IC device 100 may include a support structure 110, a non-TFT layer 120, and a TFT layer 130.

Implementations of the present disclosure may be formed or carried out on the support structure 110, which may be, e.g., a substrate, a die, a wafer or a chip. The support structure 110 may, e.g., be the wafer 2000 of FIG. 6, discussed below, and may be, or be included in, a die, e.g., the singulated die 2002 of FIG. 6, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the 3D folded SRAM cells as described herein may be built falls within the spirit and scope of the present disclosure.

The non-TFT layer 120 is referred to as such because this is a layer in which non-TFTs of a 3D folded SRAM cell may be implemented, while the TFT layer 130 is referred to as such because this is a layer in which TFTs of a 3D folded SRAM cell may be implemented, as described in greater detail below. In some embodiments, the non-TFT layer 120 may be provided in an FEOL layer (which may include a plurality of layers) and, possibly, in one or more lowest BEOL layers (i.e., in one or more BEOL layers which are closest to the support structure 110), while the TFT layer 130 may be provided in one or more BEOL layers. In other embodiments, both the non-TFT layer 120 and the TFT layer 130 may be implemented in different BEOL layers of the IC device 100.

Various BEOL layers may be, or may include, metal layers of a metallization stack and may be used to interconnect the various inputs and outputs of various components implemented in the FEOL layer (e.g., non-TFTs of 3D folded SRAM cells, logic devices, etc.) and/or various components implemented in the BEOL layer and beyond. Generally speaking, each of the metal layers of the BEOL may include electrical interconnects in the form of conductive vias and conductive lines. Conductive lines (also sometimes referred to as trenches or traces) are electrically conductive structures configured for transferring signals and power between components in a given x-y plane of the example coordinate system shown (i.e., conductive lines extend in planes that are substantially parallel to the support structure 110). Conductive vias are electrically conductive structures configured for transferring signals and power between components of two different x-y planes of the example coordinate system shown (i.e., conductive vias extend in directions that are substantially perpendicular to the support structure 110), e.g., to any of the adjacent metal layers above or below. Accordingly, conductive vias connect electrically conductive structures (e.g., conductive lines or vias) of one metal layer to electrically conductive structures of an adjacent metal layer. Conductive lines and vias of the IC device 100 may include any suitable patterns of conductive metals, e.g., copper (Cu), aluminum (AI), tungsten (W), or cobalt (Co), or metal alloys, provided in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

In some embodiments, the non-TFT layer 120 may further include other components besides the non-TFTs of 3D folded SRAM cells, such as compute logic, peripheral circuits for controlling memory operation (e.g., for controlling access (read/write), store, and refresh operations) and/or for controlling logic ICs, capacitors, TFTs, or at least portions of WLs (e.g., row selectors) and BLs (e.g., column selectors) of memory cells. In some embodiments, the TFT layer 130 may further include other components besides the TFTs of 3D folded SRAM cells, such as interconnects (e.g., conductive lines and vias of a metallization stack), capacitors (e.g., decoupling capacitors), or at least portions of WLs (e.g., row selectors) and BLs (e.g., column selectors) of memory cells. Together, the non-TFT layer 120 and the TFT layer 130 may be seen as forming a memory array 190. As such, the memory array 190 may include various transistors of SRAM cells (e.g., transistors M1-M6, described herein), as well as WLs (e.g., row selectors) and BLs (e.g., column selectors), making up SRAM cells.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, although not specifically illustrated in FIG. 1, power and signal interconnects for the various components of the IC device 100 may be present in any of the support structure 110, the non-TFT layer 120, or the TFT layer 130 shown in FIG. 1. Furthermore, although only two layers are shown in FIG. 1 to be above the support structure 110 (i.e., the non-TFT layer 120 and the TFT layer 130), in various embodiments, the IC device 100 may include any other number of layers of devices.

Figure 2A:
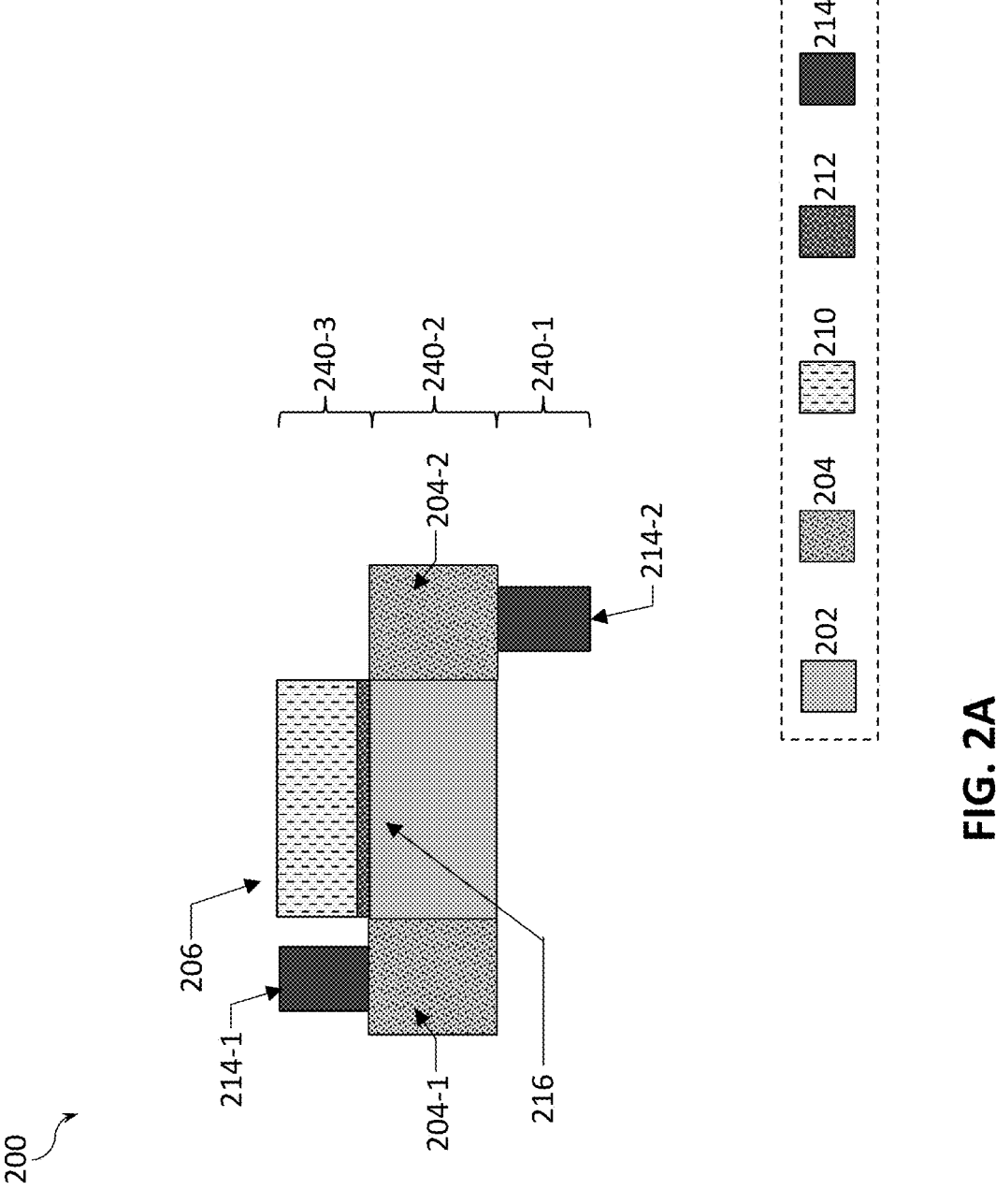
FIG. 2A provides a cross-sectional view of an example transistor that may be used as any of the transistors of the 3D folded SRAM, according to some embodiments of the present disclosure.

FIG. 2A provides a cross-sectional view of an example transistor 200 that may be used as any of the transistors of the 3D folded SRAM, described herein, according to some embodiments of the present disclosure. For example, in various embodiments, the transistor 200 may be implemented as a non-TFT of the non-TFT layer 120 of the IC device 100, or the transistor 200 may be implemented as a TFT of the TFT layer 130 of the IC device 100.

A number of elements labeled in FIG. 2A and in at least some of the subsequent drawings with reference numerals are illustrated in these drawings with different patterns, with a legend showing the correspondence between the reference numerals and patterns being provided at the bottom of each drawing. For example, the legend illustrates that FIG. 2A uses different patterns to show a channel material 202, S/D regions 204 (which may also be referred to as "diffusion regions"), a gate electrode 210 and a gate dielectric 212 of a gate stack 206, and contacts 214 to S/D regions 204.

Although a certain number of different elements may be illustrated in FIG. 2A and in at least some of the subsequent drawings, this is also simply for ease of illustration, and more, or less, than that number may be included in an IC device according to various embodiments of the present disclosure. Furthermore, arrangements shown in FIG. 2A and in at least some of the subsequent drawings are intended to show relative arrangements of various elements or components therein, and, in other embodiments, various IC devices, or portions thereof, may include other elements or components that are not illustrated. For example, although not specifically illustrated in FIG. 2A, the gate stack 206 of the transistor 200 may be surrounded by a dielectric spacer configured to provide separation between the gate stack 206 of different transistors 200 which may be provided adjacent to one another (e.g., different transistors 200 provided along a single fin if the transistors 200 are FinFETs, or different transistors 200 provided along a single nanoribbon if the transistors 200 are nanoribbon transistors), as well as between the gate stack 206 and any of the associated S/D contacts 214 that may be disposed on the same side as the gate stack 206. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organo-silicates such as silsesquioxane, siloxane, and organosilicate glass. Other examples of low-k dielectric materials that may be used as the dielectric spacer include organic polymers such as polyimide, polynorbornenes, benzocyclobutene, per-fluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon diox-ide, where large voids or pores are created in a dielectric in order to reduce the overall dielectric constant of the layer, since voids can have a dielectric constant of nearly 1. In another example, although not specifically illustrated in FIG. 2A, at least portions of the transistor 200 may be surrounded by an insulator material, such as any suitable ILD material, e.g., any of the high-k or low-k dielectrics described herein.

In general, the transistor 200 may be a FET, which is a three-terminal device that includes source, drain, and gate terminals and uses electric field to control current flowing through the device. A FET typically includes a channel material, a source region and a drain regions provided in and/or over the channel material, and a gate stack that includes a gate electrode, provided over a portion of the channel material between the source and the drain regions, and, optionally, also includes a gate dielectric between the gate electrode and the channel material. This general struc-ture is shown in FIG. 2A, illustrating a channel material 202, S/D regions 204 (shown as a first S/D region 204-1, e.g., a source region, and a second S/D region 204-2, e.g., a drain region), and a gate stack 206, which includes at least a gate electrode 210 and may also, optionally, include a gate dielectric 212.

In various embodiments, the channel material 202 may be composed of semiconductor material systems including, for example, N-type or P-type materials systems. In some embodiments, the channel material 202 may include a monocrystalline semiconductor, such as silicon (Si) or ger-manium (Ge). In some embodiments, the channel material 202 may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material 202 may include a combination of semiconductor materials where one semiconductor material may be used for the channel portion (e.g., a channel portion 216 shown in FIG. 2A, which may be the upper-most portion of the channel material 202 if the transistor 200 is a top-gated transistor as shown in FIG. 2A, or, otherwise, may be any portion of the channel material 202 that is closer to the gate electrode 210 than other portions) and another material, sometimes referred to as a "blocking material," may be used between the channel portion 216 and the support structure over which the transistor 200 is provided (e.g., the support structure 110 of FIG. 1). In some embodiments, the channel material 202 may include a high mobility oxide semiconductor material, such as tin oxide, antimony oxide, indium oxide, indium tin oxide, titanium oxide, zinc oxide, indium zinc oxide, gal-lium oxide, titanium oxynitride, ruthenium oxide, or tung-sten oxide.

For some example N-type transistor embodiments (e.g., for the embodiments where the transistor 200 is an NMOS transistor), the channel portion 216 of the channel material 202 may advantageously include a III-V material having a high electron mobility, such as, but not limited to InGaAs, InP, InSb, and InAs. For some such embodiments, the channel portion 216 of the channel material 202 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion 216 of the channel material 202 may be an intrinsic III-V material, i.e., a III-V semiconductor material not intentionally doped with any electrically active impurity. In alternate embodiments, a nominal impurity dopant level may be present within the channel portion 216 of the channel material 202, for example to further fine-tune a threshold voltage Vt, or to provide HALO pocket implants, etc. Even for impurity-doped embodiments however, impurity dopant level within the channel portion 216 of the channel material 202 may be relatively low, for example below $10^{15}$ dopant atoms per cubic centimeter (cm$^{-3}$), and advantageously below $10^{13}$ cm$^{-3}$.

For some example P-type transistor embodiments (e.g., for the embodiments where the transistor 200 is a PMOS transistor), the channel portion 216 of the channel material 202 may advantageously be a group IV material having a high hole mobility, such as, but not limited to Ge or a Ge-rich SiGe alloy. For some example embodiments, the channel portion 216 of the channel material 202 may have a Ge content between 0.6 and 0.9, and advantageously may be at least 0.7. In some embodiments with highest mobility, the channel portion 216 may be intrinsic III-V (or IV for P-type devices) material and not intentionally doped with any electrically active impurity. In alternate embodiments, one or more nominal impurity dopant level may be present within the channel portion 216, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$.

In some embodiments, the transistor 200 may be a TFT, e.g., one of the TFTs of 3D folded SRAM described herein. If the transistor 200 is a TFT, the channel material 202 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 200 is a TFT, the channel material 202 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 202 of a TFT may have a thickness between about 5 and 75 nanometers, including all values and ranges therein. In some embodiments, the channel material 202 of a TFT may be deposited at relatively low temperatures, which allows depositing the channel material 202 within the thermal budgets imposed on back end fabrication to avoid damaging other components, e.g., FEOL components or components of lower layers of the BEOL layer.

As shown in FIG. 2A, a first and a second S/D regions 204-1, 204-2 (together referred to as "S/D regions 204") may be included on either side of the gate stack 206, thus realizing a transistor. In some embodiments, the S/D regions 204 may be regions of doped semiconductors, e.g., regions of the channel material 202 (e.g., of the channel portion 216) doped with a suitable dopant to a desired dopant concentration, so as to supply charge carriers for the channel portion 216. In some embodiments, the S/D regions 204 may be highly doped, e.g., with dopant concentrations of about $1.10^{21}$ cm$^{-3}$, in order to advantageously form Ohmic contacts with the respective S/D contacts 214, although, in other embodiments, these regions may also have lower dopant concentrations and may form Schottky contacts in some implementations. Irrespective of the exact doping levels, the S/D regions 204 of the transistor 200 may be the regions having dopant concentration higher than in other regions, e.g., higher than a dopant concentration in a region of the channel material 202 between the first S/D region 204-1 and the second S/D region 204-2, and, therefore, may be referred to as "highly doped" (HD) regions. In some embodiments, the S/D regions 204 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 202 to form the S/D regions 204. An annealing process that activates the dopants and causes them to diffuse further into the channel material 202 may follow the ion implantation process. In the latter process, the one or more semiconductor materials of the channel material 202 may first be etched to form recesses at the locations for the future S/D regions. An epitaxial deposition process may then be carried out to fill the recesses with material (which may include a combination of different materials) that is used to fabricate the S/D regions 204. In some implementations, the S/D regions 204 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 204 may be formed using one or more alternate semiconductor materials such as germanium or a group III-V material or alloy. Although FIG. 2A illustrates the first and second S/D regions 204 with a single pattern, suggesting that the material composition of the first and second S/D regions 204 is the same, this may not be the case in some other embodiments of the transistor 200. Thus, in some embodiments, the material composition of the first S/D region 204-1 may be different from the material composition of the second S/D region 204-2.

FIG. 2A further illustrates example S/D contacts 214 for providing electrical connectivity to the S/D regions 204 (shown as a first S/D contact 214-1, providing electrical contact to the first S/D region 204-1, and a second S/D contact 214-2, providing electrical contact to the second S/D region 204-2). In various embodiments, one or more layers of metal and/or metal alloys may be used to form the S/D contacts 214. For example, the electrically conductive materials of the S/D contacts 214 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 214 may include one or more electrically conductive alloys, oxides, or carbides of one or more metals. In some embodiments, the S/D contacts 214 may include a doped semiconductor, such as silicon or another semiconductor doped with an N-type dopant or a P-type dopant. Using metals as contacts to various terminals of a transistor may provide higher conductivity, while using doped semiconductors as contact may be easier to pattern during fabrication. Although FIG. 2A illustrates the first and second S/D contacts 214 with a single pattern, suggesting that the material composition of the first and second S/D contacts 214 is the same, this may not be the case in some other embodiments of the transistor 200. Thus, in some embodiments, the material composition of the first S/D contact 214-1 may be different from the material composition of the second S/D contact 214-2.

FIG. 2A illustrates the first S/D contact 214-1 as a frontside contact and the second S/D contact 214-2 as a backside contact, although, in other embodiments of the transistor 200, the S/D contacts 214 may be implemented differently (e.g., both the first S/D contact 214-1 and the second S/D contact 214-2 may be frontside contacts), depending on which transistor of the 3D folded SRAM cell the transistor 200 represents. If considering the layers above a support structure (not shown in FIG. 2A, but which could be the support structure 110 of FIG. 1) over which the entire transistor 200 is built, then the second S/D contact 214-2 may be considered to be in a first layer 240-1 above the support structure, a portion of the channel material 202 between the first S/D region 204-1 and the second S/D region 204-2 (e.g., the channel portion 216) may be considered to be in a second layer 240-2 above the support structure, and the first S/D contact 214-1 may be considered to be in a third layer 240-3 over the support structure. As can be seen from FIG. 2A, the second layer 240-2 is between the first layer 240-1 and the third layer 240-3. At least a portion of the gate stack 206, or a contact to the gate stack 206 (such a gate contact not specifically shown in FIG. 2A), may be provided in the same layer as one of the S/D contacts 214, e.g., in the third layer 240-3, as shown in FIG. 2A.

Turning to the gate stack 206, the gate electrode 210 may include at least one P-type work function metal or N-type work function metal, depending on whether the transistor 200 is a P-type transistor or an N-type transistor. For a P-type transistor, metals that may be used for the gate electrode 210 may include, but are not limited to, ruthenium, palladium, platinum, cobalt, nickel, and conductive metal oxides (e.g., ruthenium oxide). For an N-type transistor, metals that may be used for the gate electrode 210 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 210 may include a stack of two or more metal layers, where one or more metal layers are work function metal layers and at least one metal layer is a fill metal layer. Further metal layers may be included for other purposes, such as to act as a diffusion barrier layer.

If used, the gate dielectric 212 may at least laterally surround the channel portion 216, and the gate electrode 210 may surround the gate dielectric 212 such that the gate dielectric 212 is disposed between the gate electrode 210 and the channel material 202. In various embodiments, the gate dielectric 212 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 212 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 212 during manufacture of the transistor 200 to improve the quality of the gate dielectric 212. In some embodiments, the gate dielectric 212 may have a thickness between about 0.5 nanometers and 3 nanometers, including all values and ranges therein, e.g., between about 1 and 3 nanometers, or between about 1 and 2 nanometers.

In some embodiments, the gate dielectric 212 may be a multilayer gate dielectric, e.g., it may include any of the high-k dielectric materials in one layer and a layer of IGZO. In some embodiments, the gate stack 206 may be arranged so that the IGZO is disposed between the high-k dielectric and the channel material 202. In such embodiments, the IGZO may be in contact with the channel material 202 and may provide the interface between the channel material 202 and the remainder of the multilayer gate dielectric 212. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, the gate dielectric 212 may be, or may include, a ferroelectric (FE) or an antiferroelectric (AFE) material, which are subsets of dielectric materials. A FE or an AFE material is a material that exhibits, over some range of temperatures, spontaneous electric polarization, i.e., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern), while a FE material is a material that can assume a state in which all of the dipoles point in the same direction. In such embodiments, the gate dielectric 212 may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides) with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as in the gate dielectric 212 and are within the scope of the present disclosure.

Figure 2C:
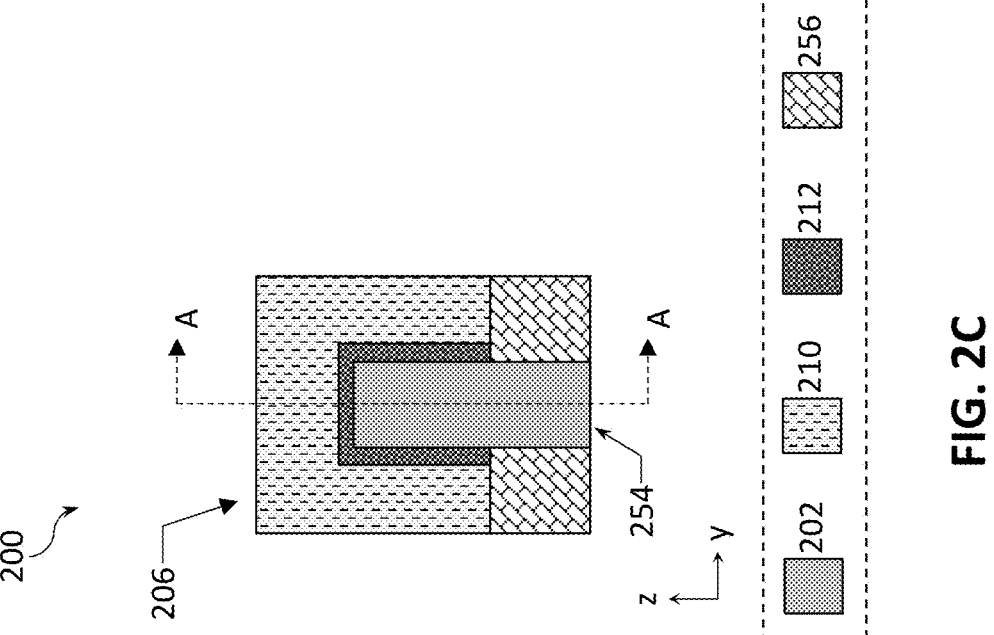
FIG. 2C provides a cross-sectional view of an example of the transistor of FIG. 2A implemented as a FinFET, according to some embodiments of the present disclosure.
Figure 2B:
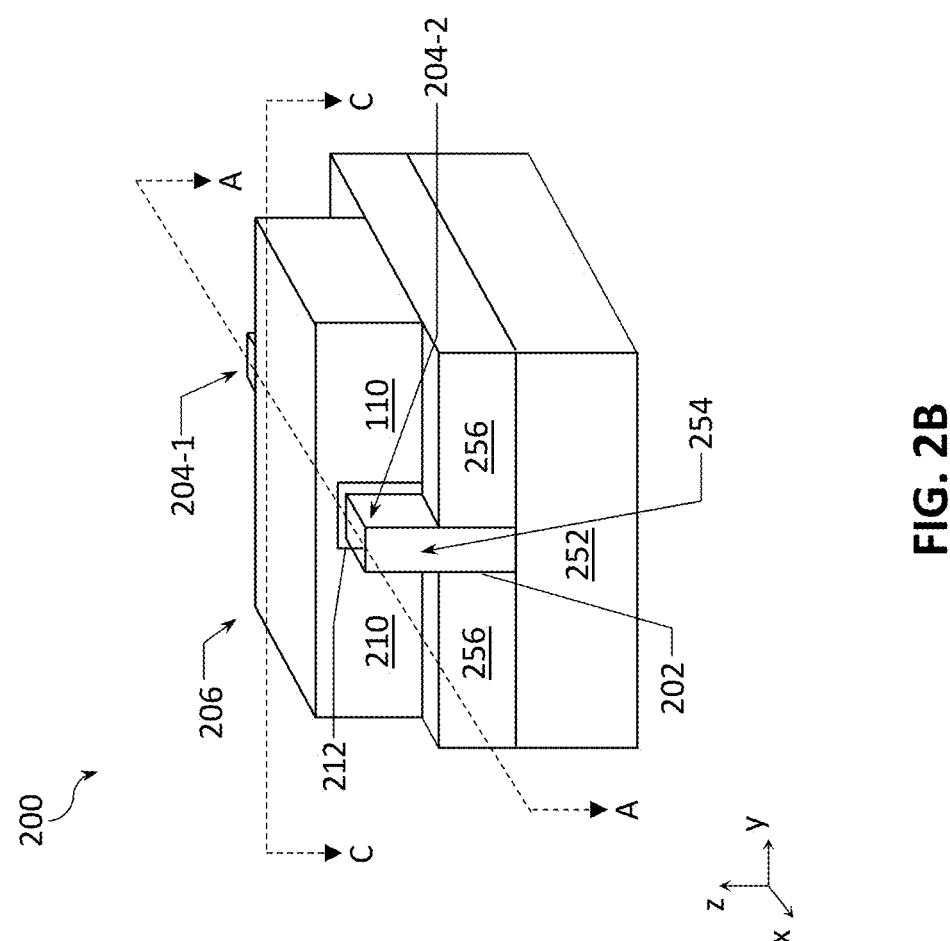
FIG. 2B provides a perspective view of an example of the transistor of FIG. 2A implemented as a fin-based field-effect transistor (FinFET), according to some embodiments of the present disclosure.
Figure 2D:
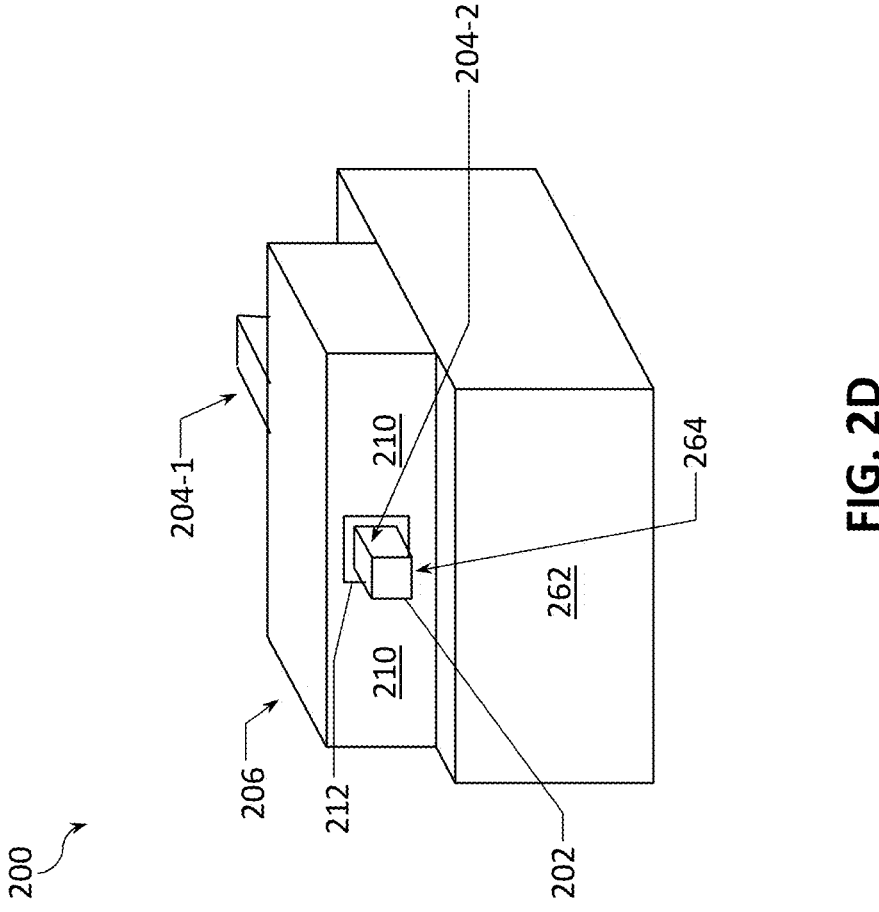
FIG. 2D provides a perspective view of an example of the transistor of FIG. 2A implemented as a nanoribbon-based transistor, according to some embodiments of the present disclosure.

In general, the transistor 200 may be implemented using any suitable transistor architecture, e.g., planar or non-planar architectures. If the transistor 200 is a TFT of a 3D folded SRAM cell as described herein, its cross-sectional view may be as shown in FIG. 2A. If the transistor 200 is a non-TFT of a 3D folded SRAM cell as described herein, its cross-sectional view may be as shown in FIGS. 2B-2C. In particular, FIGS. 2B-2C illustrate perspective and cross-sectional views of the transistor 200 implemented as a FinFET, which is one example of a non-TFT of a 3D folded SRAM cell as described herein. Another example of a non-TFT of a 3D folded SRAM cell as described herein structure is shown in FIG. 2D, illustrating a perspective view of the transistor 200 implemented as a nanoribbon-based transistor (or, simply, a nanoribbon transistor). Because FIGS. 2B-2C and FIG. 2D illustrate two different example implementations of the transistor 200 of FIG. 2A, some of the reference numerals shown in FIGS. 2B-2D are the same as those used in FIG. 2A, indicating the same or similar elements as those described with reference to FIG. 2A, so that their descriptions are not repeated for FIGS. 2B-2D.

FinFETs refer to transistors having a non-planar architecture where a fin, formed of one or more semiconductor materials, extends away from a base (where the term "base" refers to any suitable support structure on which a transistor may be built, e.g., a substrate). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode and, optionally, a layer of a gate dielectric may be provided over the top and sides of the remaining upper portion of the fin (i.e., the portion above and not enclosed by the STI), thus wrapping around the upper-most portion of the fin. The portion of the fin over which the gate stack wraps around is typically referred to as a "channel" or a "channel portion" of the fin because this is where, during operation of the transistor, a conductive channel forms, and is a part of an active region of the fin. A source region and a drain region are provided on the opposite sides of the gate stack, forming, respectively, a source and a drain terminal of a FinFET. FinFETs may be implemented as "tri-gate transistors," where the name "tri-gate" originates from the fact that, in use, such transistors may form conducting channels on three "sides" of the fin. FinFETs potentially improve performance relative to single-gate transistors and double-gate transistors. In some embodiments, non-TFTs of 3D folded SRAM cells (e.g., non-TFTs implemented in the non-TFT layer 120 of the IC device 100) may be implemented as FinFETs, e.g., as FinFETs shown in FIGS. 2B-2C.

FIGS. 2B-2C illustrate the channel material 202, the S/D regions 204, and the gate stack 206 showing the gate electrode 210 and the gate dielectric 212 as described above. As shown in FIGS. 2B-2C, when the transistor 200 is implemented as a FinFET, the transistor 200 may further include a base 252, a fin 254, and an STI 256 enclosing the subfin portion of the fin 254. The S/D contacts 214 are not specifically shown in FIGS. 2B-2C in order to not clutter the drawings. The cross-sectional side view of FIG. 2C is the view in the y-z plane of the example coordinate system x-y-z shown in FIG. 2B, with the cross-section of FIG. 2C taken across the fin 254 (e.g., along the plane shown in FIG. 2B as a plane CC). On the other hand, the cross-sectional side view of FIG. 2A is the view in the x-z plane of the example coordinate system shown in FIG. 2B with the cross-section taken along the fin 254 for one example portion of the gate stack 206 (e.g., along the plane shown in FIG. 2B and in FIG. 2C as a plane AA).

A base 252 may include any of the materials described with reference to the support structure 110. In various embodiments, the base 252 may be the support structure 110 or may be a layer of a material provided over the support structure 110 of FIG. 1. A fin 254 may extend away from the base 252 and may be substantially perpendicular to the base 252. The fin 254 may include one or more semiconductor materials, e.g., a stack of semiconductor materials, so that the upper-most portion of the fin (namely, the portion of the fin 254 enclosed by the gate stack 206) may serve as a channel portion of the transistor 200 implemented as a FinFET. Therefore, the upper-most portion of the fin 254 may be formed of the channel material 202 as described above and may include the channel portion 216 as described with reference to FIG. 2A.

The subfin of the fin 254 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For some example N-type transistor embodiments, the subfin portion of the fin 254 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the transistor 200 implemented as a FinFET where the channel portion of the fin 254 (e.g., the channel portion 216) is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 254 are each, or include, group IV semiconductors (e.g., Si, Ge, SiGe). The subfin of the fin 254 may be a first elemental semiconductor (e.g., Si or Ge) or a first SiGe alloy (e.g., having a wide bandgap). For some example P-type transistor embodiments, the subfin of the fin 254 may be a group IV material having a band offset (e.g., valance band offset for P-type devices) from the channel portion. Example materials include, but are not limited to, Si or Si-rich SiGe. In some P-type transistor embodiments, the subfin of the fin 254 is Si and at least a portion of the subfin may also be doped with impurities (e.g., N-type) to a higher impurity level than the channel portion.

As further shown in FIGS. 2B-2C, the STI 256 may enclose portions of the sides of the fin 254. A portion of the fin 254 enclosed by the STI 106 forms a subfin. In various embodiments, the STI 256 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI 256 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 206 may wrap around the upper portion of the fin 254 (the portion above the STI 256), as shown in FIGS. 2B-2C, with a channel portion of the fin 254 (e.g., the channel portion 216, described above) corresponding to the portion of the fin 254 wrapped by the gate stack 206 as shown in FIGS. 2B-2C. In particular, the gate dielectric 212 (if used) may wrap around the upper-most portion of the fin 254, and the gate electrode 210 may wrap around the gate dielectric 212. The interface between the channel portion and the subfin portion of the fin 254 may be located proximate to where the gate electrode 210 ends.

In some embodiments, the transistor 200 implemented as a FinFET may have a gate length (i.e., a distance between the first S/D region 204-1 and the second S/D region 204-2), a dimension measured along the fin 254 in the direction of the x-axis of the example reference coordinate system x-y-z shown in the present drawings, which may, in some embodiments, be between about 5 and 40 nanometers, including all values and ranges therein (e.g., between about 5 and 25 nanometers, between about 10 and 20 nanometers, between about 22 and 35 nanometers, or between about 20 and 30 nanometers). The fin 254 may have a width, a dimension measured in the direction of the y-axis of the reference coordinate system x-y-z shown in the present drawings, that may, in some embodiments, be between about 5 and 30 nanometers, including all values and ranges therein (e.g., between about 7 and 20 nanometers, or between about 10 and 15 nanometers). The fin 254 may have a height, a dimension measured in the direction of the z-axis of the reference coordinate system x-y-z shown in the present drawings, which may, in some embodiments, be between about 30 and 350 nanometers, including all values and ranges therein (e.g., between about 30 and 200nanometers, between about 75 and 250 nanometers, or between about 150 and 300 nanometers).

Although the fin 254 illustrated in FIGS. 2B-2C is shown as having a rectangular cross-section in a y-z plane of the reference coordinate system shown, in other embodiments the fin 254 may instead have a cross-section that is rounded or sloped at the "top" of the fin 254, and the gate stack 206 may conform to this rounded or sloped fin 254. In use, the transistor 200 implemented as a FinFET may form conducting channels on three "sides" of the channel portion of the fin 254, potentially improving performance relative to single-gate transistors (which may form conducting channels on one "side" of a channel material or substrate) and double-gate transistors (which may form conducting channels on two "sides" of a channel material or substrate).

While FIGS. 2B-2C illustrate a single transistor 200 implemented as a FinFET, in some embodiments, a plurality of FinFETs may be arranged next to one another (with some spacing in between) along the fin 254.

In a nanoribbon transistor, a gate stack that may include a stack of one or more gate electrode metals and, optionally, a stack of one or more gate dielectrics may be provided around a portion of an elongated semiconductor structure called "nanoribbon", forming a gate on all sides of the nanoribbon. The portion of the nanoribbon around which the gate stack wraps around is referred to as a "channel" or a "channel portion" of the nanoribbon. A semiconductor material of which the channel portion of the nanoribbon is formed is commonly referred to as a "channel material." A source region and a drain region are provided on the opposite sides of the gate stack, forming, respectively, a source and a drain of a nanoribbon transistor. Nanoribbon transistors are sometimes referred to as "wrap-around transistors" or gate all around (GAA) transistors," and may provide advantages compared to transistors of other architectures. In some embodiments, non-TFTs of 3D folded SRAM cells (e.g., non-TFTs implemented in the non-TFT layer 120 of the IC device 100) may be implemented as nanoribbon transistors, e.g., as a nanoribbon transistor shown in FIG. 2D.

FIG. 2D illustrates the channel material 202, the S/D regions 204, and the gate stack 206 showing the gate electrode 210 and the gate dielectric 212 as described above. As shown in FIG. 2D, when the transistor 200 is implemented as a nanoribbon transistor, the transistor 200 may further include a base 262 and a nanoribbon 264. The S/D contacts 214 are not specifically shown in FIG. 2D in order to not clutter the drawing.

A base 262 may include any of the materials described with reference to the support structure 110. In various embodiments, the base 262 may be the support structure 110 or may be a layer of a material provided over the support structure 110 of FIG. 1. A nanoribbon 264 may be provided above the base 262 and, in some embodiments, may extend in a direction substantially parallel to the base 262, as shown in FIG. 2D. The nanoribbon 264 may include one or more semiconductor materials, e.g., a stack of semiconductor materials, so that portions of the nanoribbon 264 enclosed by the gate stack 206 may serve as a channel portion of the transistor 200 implemented as a nanoribbon transistor and may include channel portions 216 as described with reference to FIG. 2A. In some embodiments, a layer of oxide material or any other dielectric material (not specifically shown in FIG. 2D) may be provided between the base 262 and the gate stack 206 surrounding the nanoribbon 264.

It should be noted that, although FIG. 2D depicts an embodiment in which the longitudinal axis of the nanoribbon 264 runs substantially parallel to a plane of the base 262, this need not be the case. In other embodiments of the transistor 200, the nanoribbon 264 may be oriented, e.g., "vertically" so as to be perpendicular to a plane of the base 262.

In various embodiments, the gate stack 206 may wrap entirely (as shown in FIG. 2D) or partially (e.g., almost entirely, not shown in FIG. 2D) around a portion of the nanoribbon 264, with the active region of the channel portion of the transistor 200 corresponding to the portion of the nanoribbon 264 wrapped by the gate stack 206. In particular, the gate dielectric 212 (if used) may wrap around a transversal portion of the nanoribbon 264 and the gate electrode 210 may wrap around the gate dielectric 212. In some embodiments, the gate stack 206 may fully encircle the nanoribbon 264, as shown in FIG. 2D, thus realizing a so-called GAA transistor.

In some embodiments, the transistor 200 implemented as a nanoribbon transistor may have a gate length (i.e., a distance between the first S/D region 204-1 and the second S/D region 204-2), a dimension measured along the longitudinal axis of the nanoribbon 264 (e.g., along the x-axis of FIG. 2D), which may, in some embodiments, be between about 5 and 40 nanometers, including all values and ranges therein (e.g., between about 5 and 25 nanometers, between about 10 and 20nanometers, between about 22 and 35 nanometers, or between about 20 and 30 nanometers). In some embodiments, an area of a transversal cross-section of the nanoribbon 264 may be between about 25 and 10000 square nanometers, including all values and ranges therein (e.g., between about 25 and 1000 square nanometers, or between about 25 and 500 square nanometers).

Although the nanoribbon 264 illustrated in FIG. 2D is shown as having a square cross-section, in other embodiments the nanoribbon 264 may instead have a cross-section that is rectangular but not square, a cross-section that is rounded at corners or otherwise irregularly shaped, and the gate stack 206 may conform to the shape of the nanoribbon 264. In use, the transistor 200 implemented as a nanoribbon transistor may form conducting channels on more than three "sides" of the nanoribbon 264, potentially improving performance relative to other transistor architectures.

While FIG. 2D illustrates a single transistor 200 implemented as a nanoribbon transistor, in some embodiments, a plurality of nanoribbon transistors may be arranged next to one another (with some spacing in between) along the nanoribbon 264.

In various further embodiments, the transistor 200 used as any of the transistors of the 3D folded SRAM may be implemented in many other transistor architectures besides the transistor 200 implemented as a FinFET or as a nanoribbon transistor, such as planar transistors.

Figure 3:
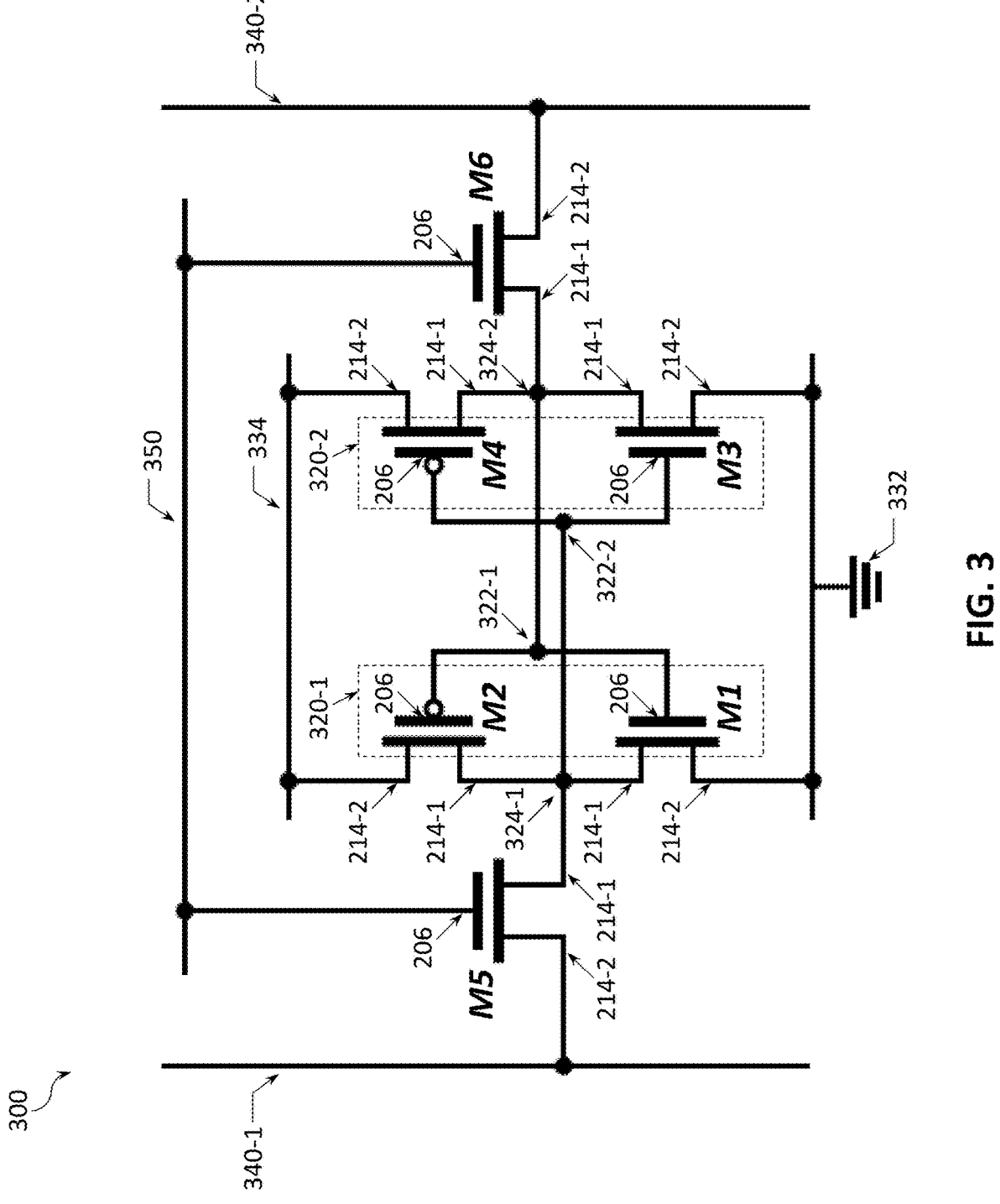
FIG. 3 provides an electric circuit diagram of an example 6-transistor (6T) SRAM cell, according to some embodiments of the present disclosure.

FIG. 3 provides an electric circuit diagram of an example 6T SRAM cell 300, according to some embodiments of the present disclosure. The SRAM cell 300 includes transistors M1-M4 for storing a bit value or a memory state (e.g., logic "1" or "0") of the cell, and two access transistors, M5 and M6, for controlling access to the cell (e.g., access to write information to the cell or access to read information from the cell 300). Each of transistors M1-M6 may be a TFT transistor (e.g., a transistor 200 as shown in FIG. 2A) or a non-TFT transistor (e.g., a transistor 200 implemented as a FinFET as shown in FIGS. 2B-2C or a transistor 200 implemented as a nanoribbon transistor as shown in FIG. 2D), depending on which one of the two designs of the 3D folded SRAM cell is being used to implement the SRAM cell 300 (the two designs shown in FIGS. 4A-4B and FIGS.

5A-5B, respectively). To illustrate that, FIG. 3 labels the first and second S/D contacts 214-1 and 214-2 and the gate stack 206 for each of transistors M1-M6. However, in other embodiments of the SRAM cell 300, one or more of transistors M1-M6 may be implemented in a geometry different from that shown in FIGS. 2A-2D. In the description of FIG. 3 and descriptions of the subsequent drawings which refer to the coupling described in FIG. 3, when element A is described to be coupled to element B, the term "coupled" covers an embodiment where element A is directly con- nected to element B. For example, a description that the gate stack 206 of transistor M1 may be coupled to the gate stack 206 of transistor M2 covers an embodiment where the gate stack 206 of transistor M1 is directly connected to the gate stack 206 of transistor M2.

FIG. 3 illustrates some transistors as N-type transistors (i.e., transistors M1, M3, M5, and M6) and other transistors as P-type transistors (i.e., transistors M2 and M4), using conventional electric circuit diagram notation for such tran- sistors. However, in other embodiments of the SRAM cell 300, this notation may be reversed (i.e., transistors M1, M3, M5, and M6 would be P-type transistors and transistors M2 and M4 would be N-type transistors), while also reversing the designation of the ground voltage 332 and the supply voltage 334 shown in FIG. 3, all of which embodiments being within the scope of the present disclosure.

In the SRAM cell 300, each bit may be stored on four transistors (M1, M2, M3, M4) that form two cross-coupled inverters 320, each having an input 322 and an output 324. The first inverter 320-1 may be formed by transistor M1 and transistor M2, while the second inverter 320-2 may be formed by transistor M3 and transistor M4. As shown in FIG. 3, the gate stack 206 of transistor M1 may be coupled to the gate stack 206 of transistor M2, and both of these gate stacks may be coupled to the input 322-1 of the first inverter 320-1. On the other hand, the first S/D contact 214-1 of transistor M1 may be coupled to the first S/D contact 214-1 of transistor M2, and both of these first S/D contacts 214-1 may be coupled to the output 324-1 of the first inverter 320-1. Similarly, for the second inverter 320-2, the gate stack 206 of transistor M3 may be coupled to the gate stack 206 of transistor M4, and both of these gate stacks may be coupled to the input 322-2 of the second inverter 320-2, while the first S/D contact 214-1 of transistor M3 may be coupled to the first S/D contact 214-1 of transistor M4, and both of these first S/D contacts 214-1 may be coupled to the output 324-2 of the second inverter 320-2. As also shown in FIG. 3, when transistors M1 and M3 are N-type transistors and when transistors M2 and M4 are P-type transistors as illustrated in FIG. 3, the second S/D contacts 214-2 of transistors M1 and M3 may be coupled to a ground voltage 332, while the second S/D contacts 214-2 of transistors M2 and M4 may be coupled to a supply voltage 334, e.g., VDD. In the embodiments of the SRAM cell 300 where the N-type transistors shown in FIG. 3 are replaced with P-type tran- sistors and vice versa, the designation of the ground voltage 332 and the supply voltage 334 would be reversed as well, all of which embodiments being within the scope of the present disclosure.

The four transistors M1-M4 in such configuration form a stable storage cell for storing a bit value of 0 or 1. As further shown in FIG. 3, two additional access transistors, M5 and M6, may serve to control the access to the storage cell of transistors M1-M4 during read and write operations. As shown in FIG. 3, the first S/D contact 214-1 of the access transistor M5 may be coupled to the output 324-1 of the first inverter 320-1. Phrased differently, the first S/D contact 214-1 of the access transistor M5 may be coupled to each of the first S/D contact 214-1 of transistor M1 and the first S/D contact 214-1 of transistor M2. The second S/D contact 214-2 of the access transistor M5 may be coupled to a first BL 340-1. Thus, each of the first S/D contact 214-1 of transistor M1 and the first S/D contact 214-1 of transistor M2 may be coupled to the first BL 340-1 (e.g., via the access transistor M5). The gate stack 206 of the access transistor M5 may be coupled to a WL 350. As further shown in FIG. 3, the first S/D contact 214-1 of the access transistor M6 may be coupled to the output 324-2 of the second inverter 320-2. Phrased differently, the first S/D contact 214-1 of the access transistor M6 may be coupled to each of the first S/D contact 214-1 of transistor M3 and the first S/D contact 214-1 of transistor M4. The second S/D contact 214-2 of the access transistor M6 may be coupled to a second BL 340-2. Thus, each of the first S/D contact 214-1 of transistor M3 and the first S/D contact 214-1 of transistor M4 may be coupled to the second BL 340-1 (e.g., via the access transistor M6). The gate stack 206 of the access transistor M6 may be coupled to the WL 350. Thus, the gate stacks 206 of both of the access transistors M5 and M6 may be coupled to a single, shared, WL, the WL 350. As also shown in FIG. 3, the input 322-1 of the first inverter 320-1 may be coupled to the first S/D contact 214-1 of the access transistor M6, while the input 322-2 of the second inverter 320-2 may be coupled to the first S/D contact 214-1 of the access transistor M5. In other words, each of the gate stack 206 of transistor M1 and the gate stack 206 of transistor M2 may be coupled to the first S/D contact 214-1 of the access transistor M6, while each of the gate stack 206 of transistor M3 and the gate stack 206 of transistor M4 may be coupled to the first S/D contact 214-1 of the access transistor M5. Phrased differently, each of the gate stack 206 of transistor M1 and the gate stack 206 of transistor M2 may be coupled to the second BL 340-2 (e.g., via the access transistor M6), while each of the gate stack 206 of transistor M3 and the gate stack 206 of transistor M4 may be coupled to the first BL 340-1 (e.g., via the access transistor M5).

The WL 350 and the first and second BLs 340 may be used together to read and program (i.e., write to) the SRAM cell 300. In particular, access to the cell may be enabled by the WL 350 which controls the two access transistors M5 and M6 which, in turn, control whether the cell 300 should be connected to the BLs 340-1 and 340-2. During operation of the SRAM cell 300, a signal on the first BL 340-1 may be complementary to a signal on the second BL 340-2. The two BLs 340 may be used to transfer data for both read and write operations. In other embodiments of the SRAM cell 300, only a single BL 340 may be used, instead of two BLs 340-1 and 340-2 (i.e., the signal on the BL 340-1 and BL 340-2 may be the same), although having one signal BL and one inverse, such as the two BLs 340, may help improve noise margins.

During read accesses, the BLs 340 are actively driven high and low by the inverters 320 in the SRAM cell 300. This may improve SRAM bandwidth compared to DRAM. The symmetric structure of the SRAMs cell 300 also allows for differential signaling, which may provide an improve- ment in detecting small voltage swings. Another difference with DRAM that may contribute to making SRAM faster than DRAM is that commercial chips accept all address bits at a time. By comparison, commodity DRAMs may have the address multiplexed in two halves, i.e., higher bits followed by lower bits, over the same package pins in order to keep their size and cost down.

Each of the WL 350 and the BLs 340, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

Figures 4A, 4B:
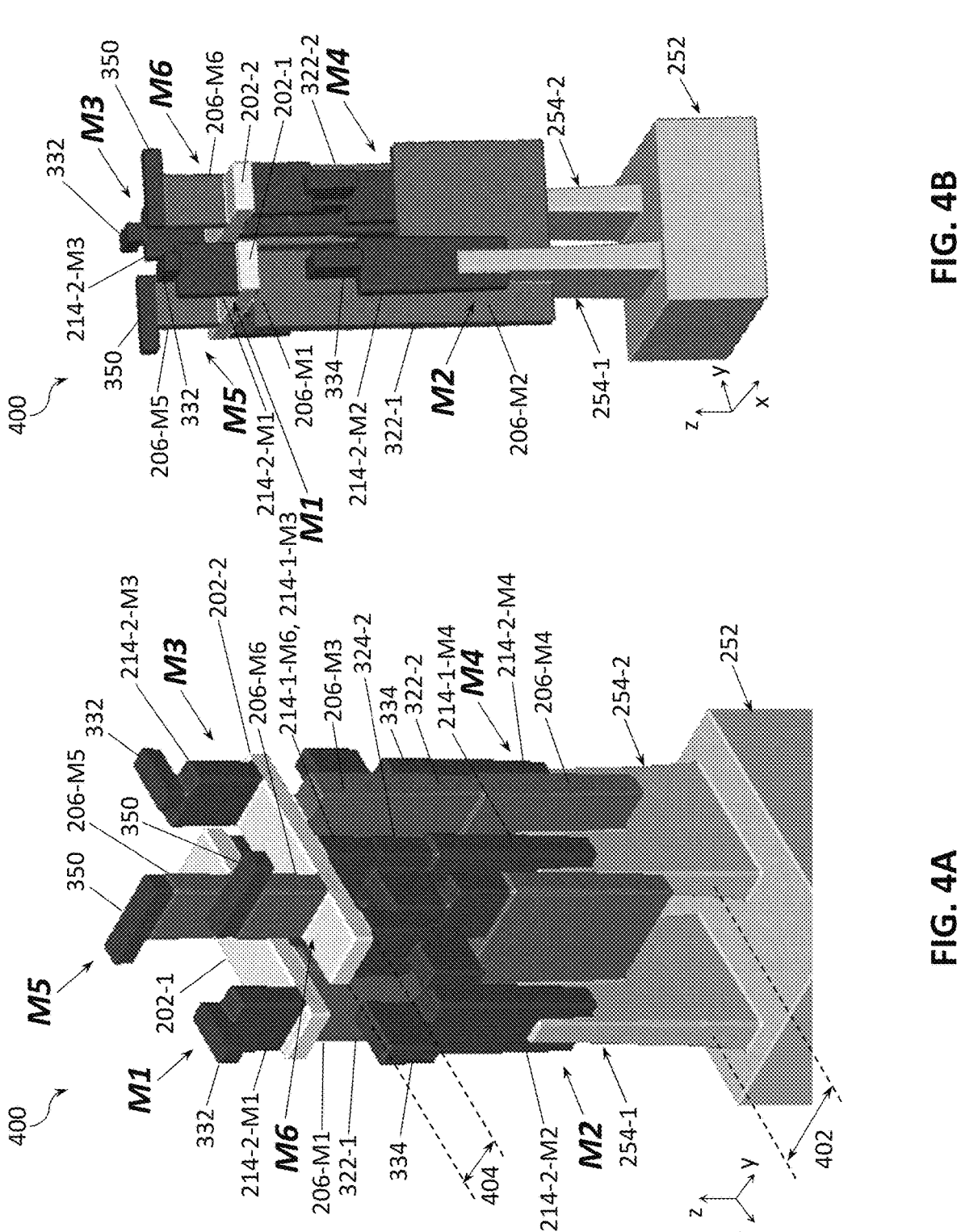
FIGS. 4A-4B provide different perspective views of a first design of an example 3D folded SRAM cell, according to some embodiments of the present disclosure.
Figures 5A, 5B:
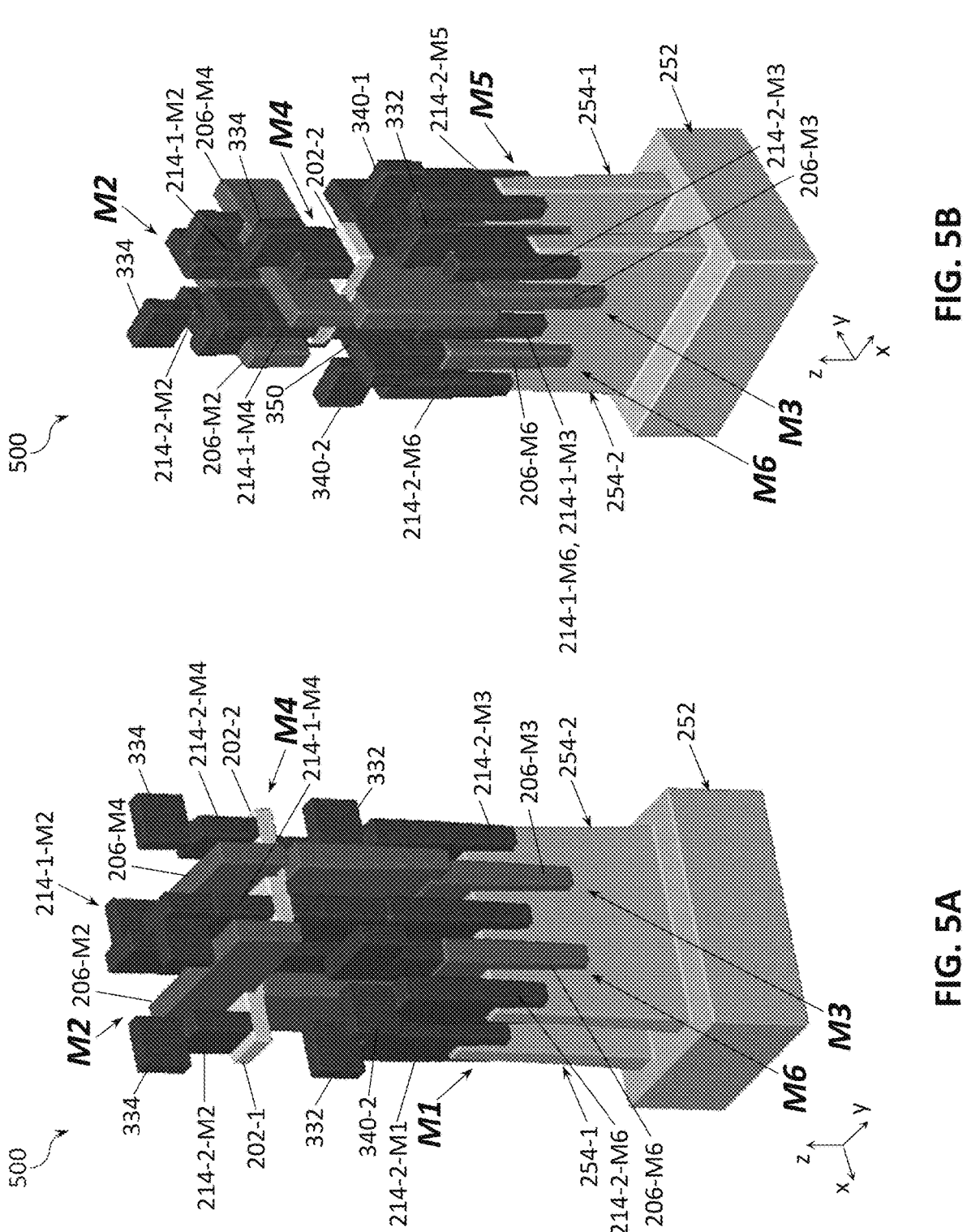
FIGS. 5A-5B provide different perspective views of a second design of an example 3D folded SRAM cell, according to some embodiments of the present disclosure.

Embodiments of two different 3D folded SRAM designs for an SRAM cell 300 are presented herein. The first design is illustrated in FIGS. 4A-4B, providing different perspective views of an example SRAM cell 400 implemented as a 3D folded SRAM cell where four transistors of one type (i.e., transistors M1, M3, M5, and M6) are implemented as TFTs and stacked above (e.g., folded over) two transistors of the other type (i.e., transistors M2 and M4) that are implemented as non-TFTs. The second design is illustrated in FIGS. 5A-5B, providing different perspective views of an example SRAM cell 500 implemented as a 3D folded SRAM cell where two transistors of one type (i.e., transistors M2 and M4) are implemented as TFTs and stacked above (i.e., folded over) four transistors of the other type (i.e., transistors M1, M3, M5, and M6) that are implemented as non-TFTs. Each of the SRAM cell 400 and the SRAM cell 500 may be an example of the SRAM cell 300 of FIG. 3 where the non-TFTs are implemented as FinFETs as shown in FIGS. 2B-2C, and may be a part of the IC device 100 of FIG. 1. Two different views are shown in FIGS. 4A-4B in an attempt to bring clarity of the arrangement of the SRAM cell 400 and, similarly, two different views are shown in FIGS. 5A-5B in an attempt to bring clarity of the arrangement of the SRAM cell 500, where different elements may be labeled in different views. It should be noted that not all elements shown in FIGS. 4A-4B and FIGS. 5A-5B are labeled with reference numerals in order to not clutter the drawings. Because FIGS. 4A-4B and FIGS. 5A-5B illustrate two example implementations of the SRAM cell 300 of FIG. 3, where the non-TFTs are implemented as FinFETs as shown in FIGS. 2B-2C, some of the reference numerals shown in FIGS. 4A-4B and FIGS. 5A-5B are the same as those used in FIGS. 2B-2C and in FIG. 3, indicating the same or similar elements as those described with reference to FIGS. 2B-2C and in FIG. 3, so that their descriptions are not repeated for FIGS. 4A-4B and FIGS. 5A-5B. Some other reference numerals shown in FIGS. 4A-4B and FIGS. 5A-5B start out the same as those used in FIGS. 2B-2C but include a dash and a reference to one of transistors M1-M6, to indicate to which transistor 200 of transistors M1-M6 of the SRAM cell 400/500 they belong. For example, FIGS. 4A-4B and FIGS. 5A-5B use the reference numeral "206-M1" to indicate a gate stack 206 of transistor M1, or use the reference numeral "214-2-M1" to indicate a second S/D contact 214-2 of transistor M1, etc.

As shown in FIGS. 4A-4B, the SRAM cell 400 includes a first fin 254-1 and a second fin 254-2, provided substantially parallel to one another over a base 252. Consistent with FIGS. 2B-2C, the longitudinal axes of the fins 254-1 and 254-2 extend in directions parallel to the x-axis of the example coordinate system shown in the present drawings. In some embodiments, a pitch 402 (e.g., measured as a center-to-center distance) of the first fin 254-1 and the second fin 254-2 (i.e., a dimension measured in a direction of the y-axis of the example coordinate system shown in the present drawings) may be between about 10 nanometers and 1000 nanometers, e.g., between about 10 nanometers and 100 nanometers, or between about 15 nanometers and 30 nanometers. Transistor M2 is built based on the first fin 254-1 (i.e., a channel portion 216 of transistor M2 is a portion of the first fin 254-1). Transistor M4 is built based on the second fin 254-2 (i.e., a channel portion 216 of transistor M4 is a portion of the second fin 254-2). Transistors M2 and M4 of the SRAM cell 400 are FinFETs (i.e., transistors M2 and M4 are non-TFTs), implemented in the non-TFT layer 120 of the IC device 100.

As further shown in FIGS. 4A-4B, the SRAM cell 400 includes a structure of a first channel material 202-1 and a structure of a second channel material 202-2, where these structures may be elongated structures similar to the fins 254-1, 254-2, with their longitudinal axes being substantially parallel to those of the fins 254-1, 254-2 (i.e., also extending in directions parallel to the x-axis of the example coordinate system shown in the present drawings). In some embodiments, a width 404 (i.e., a dimension measured in a direction of the y-axis of the example coordinate system shown in the present drawings) of each of the channel structures 202-1 and 202-2 may be between about 10 nanometers and 500 nanometers, e.g., between about 10 nanometers and 100 nanometers, or between about 15 nanometers and 30 nanometers. In some embodiments, a length (i.e., a dimension measured in a direction of the x-axis of the example coordinate system shown in the present drawings) of each of the channel structures 202-1 and 202-2 may be larger than their respective width 404. In some embodiments, the structure of the first channel material 202-1 may be stacked above the first fin 254-1, i.e., projections of the structure of the first channel material 202-1 and the first fin 254-1 onto a plane of the base 252, or a plane of the support structure 110 of the IC device 100, may be at least partially overlapping. In some embodiments, said projections of the structure of the first channel material 202-1 and the first fin 254-1 may be overlapping in that they are substantially center-aligned, when their centers are defined as lines extending through their middles in the direction of the x-axis of the example coordinate system shown. Similarly, in some embodiments, the structure of the second channel material 202-2 may be stacked above the second fin 254-2, i.e., projections of the structure of the second channel material 202-2 and the second fin 254-2 onto a plane of the base 252, or a plane of the support structure 110 of the IC device 100, may be at least partially overlapping. In some embodiments, said projections of the structure of the second channel material 202-2 and the second fin 254-2 may be overlapping in that they are substantially center-aligned, when their centers are defined as lines extending through their middles in the direction of the x-axis of the example coordinate system shown.

The first channel material 202-1 and the second channel material 202-2 are thin film channel materials so that the transistors provided over them are TFTs. Each of transistors M1 and M5 is built based on the first channel material 202-1 (i.e., the channel portion 216 of transistor M1 is a first portion of the first channel material 202-1 and the channel portion 216 of transistor M5 is a second portion of the first channel material 202-1). Each of transistors M6 and M3 is built based on the second channel material 202-2 (i.e., the channel portion 216 of transistor M6 is a first portion of the second channel material 202-2 and the channel portion 216 of transistor M3 is a second portion of the second channel material 202-2). Transistors M1, M5, M6, and M3 of the SRAM cell 400 are TFTs, implemented in the TFT layer 130 of the IC device 100.

In the SRAM cell 400, providing transistors M1 and M5 along a single shared structure of the first channel material 202-1 may advantageously allow coupling their first S/D regions 204-1 to one another by virtue of implementing a single shared S/D region that is both, the first S/D region 204-1 of transistor M1 and the first S/D region 204-1 of transistor M5. Thus, the SRAM cell 400 may include a single shared first S/D contact that serves as both the first S/D contact 214-1-M1 of transistor M1 and the first S/D contact 214-1-M5 of transistor M5.

Stacking the structure of the first channel material 202-1 over the first fin 254-1 may advantageously allow coupling the shared first S/D region 204-1 of transistors M1 and M5 to the first S/D region 204-1 of transistor M2 implemented based on the first fin 254-1. This may be implemented by arranging transistors M1 and M5 to have their shared first S/D contact 214-1 be a backside contact (i.e., the contact is closer to the base 252 or the support structure 110 than the channel material 202-1). With such an arrangement, the shared first S/D contact 214-1 of transistors M1 and M5 may extend down (i.e., towards the base 252 or the support structure 110) to be electrically continuous (e.g., materially continuous) with the first S/D contact 214-1-M2 of transistor M2. Thus, the output 324-1 of the first inverter 320-1 of the SRAM cell 300 may be realized for the SRAM cell 400 as an electrically continuous structure that serves as the first S/D contact 214-1 for each of transistors M1, M5, and M2.

As shown in FIGS. 4A-4B, in some embodiments, the second S/D contact 214-2-M1 of transistor M1 may be a frontside contact (i.e., the contact is further away from the base 252 or the support structure 110 than the channel material 202-1), while the second S/D contact 214-2-M5 of transistor M5 may be a backside contact. This may be different in other embodiments of the SRAM cell 400.

Furthermore, as shown in FIGS. 4A-4B, in some embodiments, transistor M1 may be arranged to be closer to transistor M2 than transistor M5. For example, transistors M1, M2, and M5 may be arranged so that a projection of the gate stack 206-M1 of transistor M1 onto a plane of the base 252 or the support structure is closer to (and may at least partially overlap with) a similar projection of the gate stack 206-M2 of transistor M2 than a projection of the gate stack 206-M5 of transistor M5. Such an arrangement of transistors M1, M2, and M5 may advantageously allow coupling the gate stack 206-M1 of transistor M1 to the gate stack 206-M2 of transistor M2 by implementing an electrically continuous structure that serves as a shared gate for transistors M1 and M2, which may be the input 322-1 of the first inverter 320-1.

As shown in FIGS. 4A-4B, in some embodiments, transistor M5 may be a top-gated TFT (i.e., the gate 206-M5 of transistor M5 is further away from the base 252 or the support structure 110 than the corresponding channel material 202), while transistor M1 may be a back-gated TFT (i.e., the gate 206-M1 of transistor M1 is closer to the base 252 or the support structure 110 than the corresponding channel material 202). This may be different in other embodiments of the SRAM cell 400.

Arranging transistors M1, M5, and M2 of the SRAM cell 400 in the manner described above, the surface area occupied by transistors M1, M5, and M2 may be substantially the same, or larger but within acceptable limits (e.g., less than about 90% larger, less than about 75% larger, or less than about 50% larger) than the surface area occupied by transistors M1 and M5 or substantially the same, or larger but within acceptable limits (e.g., less than about 90% larger, less than about 75% larger, or less than about 50% larger) than the surface area occupied by transistor M2, which may lead to substantial increase in the density of SRAM cells 400 that may be implemented in a shared support structure 110 of the IC device 100.

Similar to transistors M1 and M5 of the SRAM cell 400, providing transistors M6 and M3 of the SRAM cell 400 along a single shared structure of the second channel material 202-2 may advantageously allow coupling their first S/D regions 204-1 to one another by virtue of implementing a single shared S/D region that is both, the first S/D region 204-1 of transistor M6 and the first S/D region 204-1 of transistor M3. Thus, the SRAM cell 400 may include a single shared S/D contact that serves as both the first S/D contact 214-1-M6 of transistor M6 and the first S/D contact 214-1-M3 of transistor M3.

Stacking the structure of the second channel material 202-2 over the second fin 254-2 may advantageously allow coupling the shared first S/D region 204-1 of transistors M6 and M3 to the first S/D region 204-1 of transistor M4 implemented based on the second fin 254-2. This may be implemented by arranging transistors M6 and M3 to have their shared first S/D contact 214-1 be a backside contact. With such an arrangement, the shared first S/D contact 214-1 of transistors M6 and M3 may extend down (i.e., towards the base 252 or the support structure 110) to be electrically continuous (e.g., materially continuous) with the first S/D contact 214-1-M4 of transistor M4. Thus, the output 324-2 of the second inverter 320-2 of the SRAM cell 300 may be realized for the SRAM cell 400 as an electrically continuous structure that serves as the first S/D contact 214-1 for each of transistors M6, M3, and M4.

As shown in FIGS. 4A-4B, in some embodiments, the second S/D contact 214-2-M3 of transistor M3 may be a frontside contact, while the second S/D contact 214-2-M6 of transistor M6 may be a backside contact. Arranging each of transistors M1 and M3 as having one frontside S/D contact (i.e., the second S/D contact 214-2-M1 and the second S/D contact 214-2-M3) and having one backside S/D contact (i.e., the first S/D contact 214-1-M1 and the first S/D contact 214-1-M3) may be particularly advantageous in terms of coupling the first S/D contacts 214-1 of these transistors to first S/D contacts 214-1 of other transistors and routing of signals to second S/D contacts 214-2 of these transistors. This may be different in other embodiments of the SRAM cell 400.

Furthermore, as shown in FIGS. 4A-4B, in some embodiments, transistor M3 may be arranged to be closer to transistor M4 than transistor M6. For example, transistors M3, M4, and M6 may be arranged so that a projection of the gate stack 206-M3 of transistor M3 onto a plane of the base 252 or the support structure is closer to (and may at least partially overlap with) a similar projection of the gate stack 206-M4 of transistor M4 than a projection of the gate stack 206-M6 of transistor M6. Such an arrangement of transistors M3, M4, and M6 may advantageously allow coupling the gate stack 206-M3 of transistor M3 to the gate stack 206-M4 of transistor M4 by implementing an electrically continuous structure that serves as a shared gate for transistors M1 and M2, which may be the input 322-2 of the second inverter 320-2.

As shown in FIGS. 4A-4B, in some embodiments, transistor M6 may be a top-gated TFT, while transistor M3 may be a back-gated TFT. This may be different in other embodiments of the SRAM cell 400.

Arranging transistors M3, M4, and M6 of the SRAM cell 400 in the manner described above, the surface area occupied by transistors M3, M4, and M6 in the SRAM cell 400 may be substantially the same, or larger but within acceptable limits (e.g., less than about 90% larger, less than about 75% larger, or less than about 50% larger) than the surface area occupied by transistors M3 and M6 or substantially the same, or larger but within acceptable limits (e.g., less than about 90% larger, less than about 75% larger, or less than about 50% larger) than the surface area occupied by transistor M4, which may lead to substantial increase in the density of SRAM cells 400 that may be implemented in a shared support structure 110 of the IC device 100.

FIGS. 4A-4B further provides labels for some other terminals and connections of the SRAM cell 300 and their descriptions provided with respect to the SRAM cell 300 are applicable to the SRAM cell 400.

Turning to the second design of a 3D folded SRAM cell, an SRAM cell 500 of FIGS. 5A-5B includes a first fin 254-1, a second fin 254-2, a structure of a first channel material 202-1, and a structure of a second channel material 202-2. Descriptions of the fins 254, the structures of the channel material 202, and their relation to one another (e.g., pitch of the fins 254, width of the structures of the channel material 202, and stacking of the structures of the channel material 202 over the fins 254) provided for the SRAM cell 400 are applicable to the SRAM cell 500 and, therefore, not repeated. The first and second designs differ in which transistors are implemented as non-TFTs and which transistors are implemented as TFTs. In particular, in FIGS. 4A-4B, two transistors are non-TFTs and four transistors are TFTs, while, in FIGS. 5A-5B, four transistors are non-TFTs and two transistors are TFTs. These differences will now be described.

In the SRAM cell 500, each of transistors M1 and M5 is built based on the first fin 254-1 (i.e., a channel portion 216 of transistor M1 is a first portion of the first fin 254-1 and a channel portion 216 of transistor M5 is a second portion of the first fin 254-1). It should be noted that transistor M5 is obscured in the view of FIG. 5A and, therefore, not labeled in FIG. 5A, while transistor M1 is obscured in the view of FIG. 5B and, therefore, not labeled in FIG. 5B. Each of transistors M6 and M3 is built based on the second fin 254-2 (i.e., a channel portion 216 of transistor M6 is a first portion of the second fin 254-2 and a channel portion 216 of transistor M3 is a second portion of the second fin 254-2). Transistors M1, M5, M6, and M3 of the SRAM cell 500 are FinFETs (i.e., transistors M1, M5, M6, and M3 are non-TFTs), implemented in the non-TFT layer 120 of the IC device 100. On the other hand, transistors M2 and M4 of the SRAM cell 500 are TFTs because they are built based on, respectively, a structure of the first channel material 202-1 and a structure of the second channel material 202-2 which are thin film structures. Transistor M2 is built based on the first channel material 202-1 (i.e., a channel portion 216 of transistor M2 is a portion of the first channel material 202-1). Transistor M4 is built based on the second channel material 202-2 (i.e., a channel portion 216 of transistor M4 is a portion of the second channel material 202-2). Transistors M2 and M4 of the SRAM cell 500 are TFTs, implemented in the TFT layer 130 of the IC device 100.

In the SRAM cell 500, providing transistors M1 and M5 along a single first fin 254-1 may advantageously allow coupling their first S/D regions 204-1 to one another by virtue of implementing a single shared S/D region that is both, the first S/D region 204-1 of transistor M1 and the first S/D region 204-1 of transistor M5. Thus, similar to the SRAM cell 400, the SRAM cell 500 may include a single shared S/D contact that serves as both the first S/D contact 214-1-M1 of transistor M1 and the first S/D contact 214-1-M5 of transistor M5.

Stacking the structure of the first channel material 202-1 over the first fin 254-1 may advantageously allow coupling the shared first S/D region 204-1 of transistors M1 and M5 to the first S/D region 204-1 of transistor M2 implemented based on the structure of the first channel material 202-1 in the SRAM cell 500. For example, the shared first S/D contact 214-1 of transistors M1 and M5 may extend up (i.e., away from the base 252 or the support structure 110) to be electrically continuous (e.g., materially continuous) with the first S/D contact 214-1-M2 of transistor M2. Thus, similar to the SRAM cell 400, the output 324-1 of the first inverter 320-1 of the SRAM cell 300 may be realized for the SRAM cell 500 as an electrically continuous structure that serves as the first S/D contact 214-1 for each of transistors M1, M5, and M2.

Furthermore, similar to the SRAM cell 400, as shown in FIGS. 5A-5B, in some embodiments of the SRAM cell 500, transistor M1 may be arranged to be closer to transistor M2 than to transistor M5. For example, transistors M1, M2, and M5 of the SRAM cell 500 may be arranged so that a projection of the gate stack 206-M1 of transistor M1 onto a plane of the base 252 or the support structure is closer to (and may at least partially overlap with) a similar projection of the gate stack 206-M2 of transistor M2 than a projection of the gate stack 206-M5 of transistor M5. Similar to the SRAM cell 400, such an arrangement of transistors M1, M2, and M5 in the SRAM cell 500 may advantageously allow coupling the gate stack 206-M1 of transistor M1 to the gate stack 206-M2 of transistor M2 by implementing an electrically continuous structure that serves as a shared gate for transistors M1 and M2, which may be the input 322-1 of the first inverter 320-1.

As shown in FIGS. 5A-5B, in some embodiments, both transistor M2 and transistor M4 may be top-gated TFTs. This may be different in other embodiments of the SRAM cell 400.

Arranging transistors M1, M5, and M2 of the SRAM cell 500 in the manner described above, the surface area occupied by transistors M1, M5, and M2 in the SRAM cell 500 may be substantially the same, or larger but within acceptable limits (e.g., less than about 90% larger, less than about 75% larger, or less than about 50% larger) than the surface area occupied by transistors M1 and M5 or substantially the same, or larger but within acceptable limits (e.g., less than about 90% larger, less than about 75% larger, or less than about 50% larger) than the surface area occupied by transistor M2, which may lead to substantial increase in the density of SRAM cells 500 that may be implemented in a shared support structure 110 of the IC device 100.

Similar to transistors M1 and M5 of the SRAM cell 500, providing transistors M6 and M3 of the SRAM cell 500 along a single second fin 254-2 may advantageously allow coupling their first S/D regions 204-1 to one another by virtue of implementing a single shared S/D region that is both, the first S/D region 204-1 of transistor M6 and the first S/D region 204-1 of transistor M3. Thus, similar to the SRAM cell 400, the SRAM cell 500 may include a single shared S/D contact that serves as both the first S/D contact 214-1-M6 of transistor M6 and the first S/D contact 214-1-M3 of transistor M3.

Stacking the structure of the second channel material 202-2 over the second fin 254-2 may advantageously allow coupling the shared first S/D region 204-1 of transistors M6 and M3 to the first S/D region 204-1 of transistor M4 implemented based on the structure of the second channel material 202-2. For example, the shared first S/D contact 214-1 of transistors M6 and M3 may extend up (i.e., away from the base 252 or the support structure 110) to be electrically continuous (e.g., materially continuous) with the first S/D contact 214-1-M4 of transistor M4. Thus, similar to the SRAM cell 400, the output 324-2 of the second inverter 320-2 of the SRAM cell 300 may be realized for the SRAM cell 500 as an electrically continuous structure that serves as the first S/D contact 214-1 for each of transistors M6, M3, and M4.

As shown in FIGS. 5A-5B, in some embodiments, the second S/D contact 214-2-M2 and the second S/D contact 214-2-M4 may be a frontside contact, while the first S/D contacts 214-1 of these transistors may have both a portion on the frontside and a portion on the backside of their corresponding channel materials 202. Arranging transistor M2 of the SRAM cell 500 as having one portion of its first S/D contact 214-1-M2 as a frontside S/D contact may be particularly advantageous in terms of coupling the first S/D contact 214-1-M2 to the gate contact 206-M4 of transistor M4 when transistor M4 is a top-gated transistor. Arranging transistor M2 of the SRAM cell 500 as having another portion of its first S/D contact 214-1-M2 as a backside S/D contact may be particularly advantageous in terms of coupling the first S/D contact 214-1-M2 to the first S/D contact 214-1-M1 of transistor M1 and/or to the first S/D contact 214-1-M5 of transistors M5 (e.g., to a shared first S/D contact 214-1 of transistors M1 and M5). Similarly, arranging transistor M4 of the SRAM cell 500 as having one portion of its first S/D contact 214-1-M4 as a frontside S/D contact may be particularly advantageous in terms of coupling the first S/D contact 214-1-M4 to the gate contact 206-M2 of transistor M2 when transistor M2 is a top-gated transistor. Arranging transistor M4 of the SRAM cell 500 as having another portion of its first S/D contact 214-1-M4 as a backside S/D contact may be particularly advantageous in terms of coupling the first S/D contact 214-1-M4 to the first S/D contact 214-1-M6 of transistor M6 and/or to the first S/D contact 214-1-M3 of transistors M3 (e.g., to a shared first S/D contact 214-1 of transistors M6 and M3). This may be different in other embodiments of the SRAM cell 400.

Furthermore, similar to the SRAM cell 400, as shown in FIGS. 5A-5B, in some embodiments of the SRAM cell 500, transistor M3 may be arranged to be closer to transistor M4 than to transistor M6. For example, transistors M3, M4, and M6 of the SRAM cell 500 may be arranged so that a projection of the gate stack 206-M3 of transistor M3 onto a plane of the base 252 or the support structure is closer to (and may at least partially overlap with) a similar projection of the gate stack 206-M4 of transistor M4 than a projection of the gate stack 206-M6 of transistor M6. Similar to the SRAM cell 400, such an arrangement of transistors M3, M4, and M6 in the SRAM cell 500 may advantageously allow coupling the gate stack 206-M3 of transistor M3 to the gate stack 206-M4 of transistor M4 by implementing an electrically continuous structure that serves as a shared gate for transistors M3 and M4, which may be the input 322-2 of the second inverter 320-2.

Arranging transistors M3, M4, and M6 of the SRAM cell 500 in the manner described above, the surface area occupied by transistors M3, M4, and M6 in the SRAM cell 500 may be substantially the same, or larger but within acceptable limits (e.g., less than about 90% larger, less than about 75% larger, or less than about 50% larger) than the surface area occupied by transistors M3 and M6 or substantially the same, or larger but within acceptable limits (e.g., less than about 90% larger, less than about 75% larger, or less than about 50% larger) than the surface area occupied by transistor M4, which may lead to substantial increase in the density of SRAM cells 500 that may be implemented in a shared support structure 110 of the IC device 100.

FIGS. 5A-5B further provides labels for some other terminals and connections of the SRAM cell 300 and their descriptions provided with respect to the SRAM cell 300 are applicable to the SRAM cell 500.

Various device assemblies illustrated in FIGS. 1-5 do not represent an exhaustive set of IC devices with 3D folded SRAM cells as described herein, but merely provide examples of such devices/structures/assemblies. For example, while FIG. 3 illustrates some transistors as N-type transistors (i.e., transistors M1, M3, M5, and M6) and other transistors as P-type transistors (i.e., transistors M2 and M4), all of the descriptions provided above are equally applicable to the embodiments of 3D folded SRAM cells where this designation is interchanged (i.e., transistors M1, M3, M5, and M6 could be P-type transistors, and transistors M2 and M4 could be N-type transistors), provided that the designations of the ground voltage 332 and the supply voltage 334 in FIG. 3 would also be switched (i.e., in such embodiments, reference numeral 332 would refer to the supply voltage and reference numeral 334 would refer to the ground voltage). In another example, in some embodiments, logic devices, e.g., implemented as/using the transistors 200 or implemented as/using transistors of any other architecture, may be included in any of the IC devices shown in FIGS. 1-5, either in the same or separate metal layers from those in which the memory cells are shown. The number and positions of various elements shown in FIGS. 1-5 is purely illustrative and, in various other embodiments, other numbers of these elements, provided in other locations relative to one another may be used in accordance with the general architecture considerations described herein.

Further, FIGS. 2, 4, and 5 are intended to show relative arrangements of the elements therein, and the device assemblies of these figures may include other elements that are not specifically illustrated (e.g., various interfacial layers). Similarly, although particular arrangements of materials are discussed with reference to FIGS. 1-5, intermediate materials may be included in the IC devices and assemblies of these figures. Still further, although some elements of the various views are illustrated in FIGS. 2, 4, and 5 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of the 3D folded SRAM cells as described herein.

Arrangements with one or more 3D folded SRAM cells as disclosed herein may be included in any suitable electronic device. FIGS. 6-9 illustrate various examples of devices and components that may include one or more three-dimensional memory arrays as disclosed herein.

Figure 6:
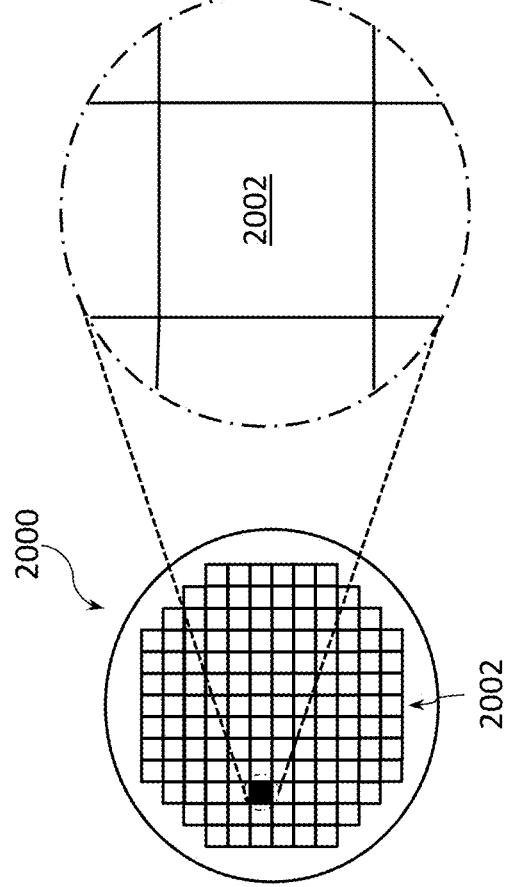
FIG. 6 illustrates a wafer and dies that may include one or more 3D folded SRAM cells in accordance with any of the embodiments disclosed herein.

FIG. 6 illustrates a wafer 2000 and dies 2002 that may include one or more 3D folded SRAM cells in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 7. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more memory arrays with 3D folded SRAM cells as described herein). After the fabrication of the semiconductor product is complete (e.g., after manufacture of one or more layers of the 3D folded SRAM cells as described herein, e.g., any embodiment of the memory array 190 of the IC device 100, e.g., including an array of any of the memory cells described herein), the wafer 2000 may undergo a singulation process in which each of the dies 2002 is separated from one another to provide discrete "chips" of the semiconductor product. In particular, devices that include one or more 3D folded SRAM cells as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 9) or other logic that is configured to store information in the memory devices or execute instructions stored in the memory array.

Figure 7:
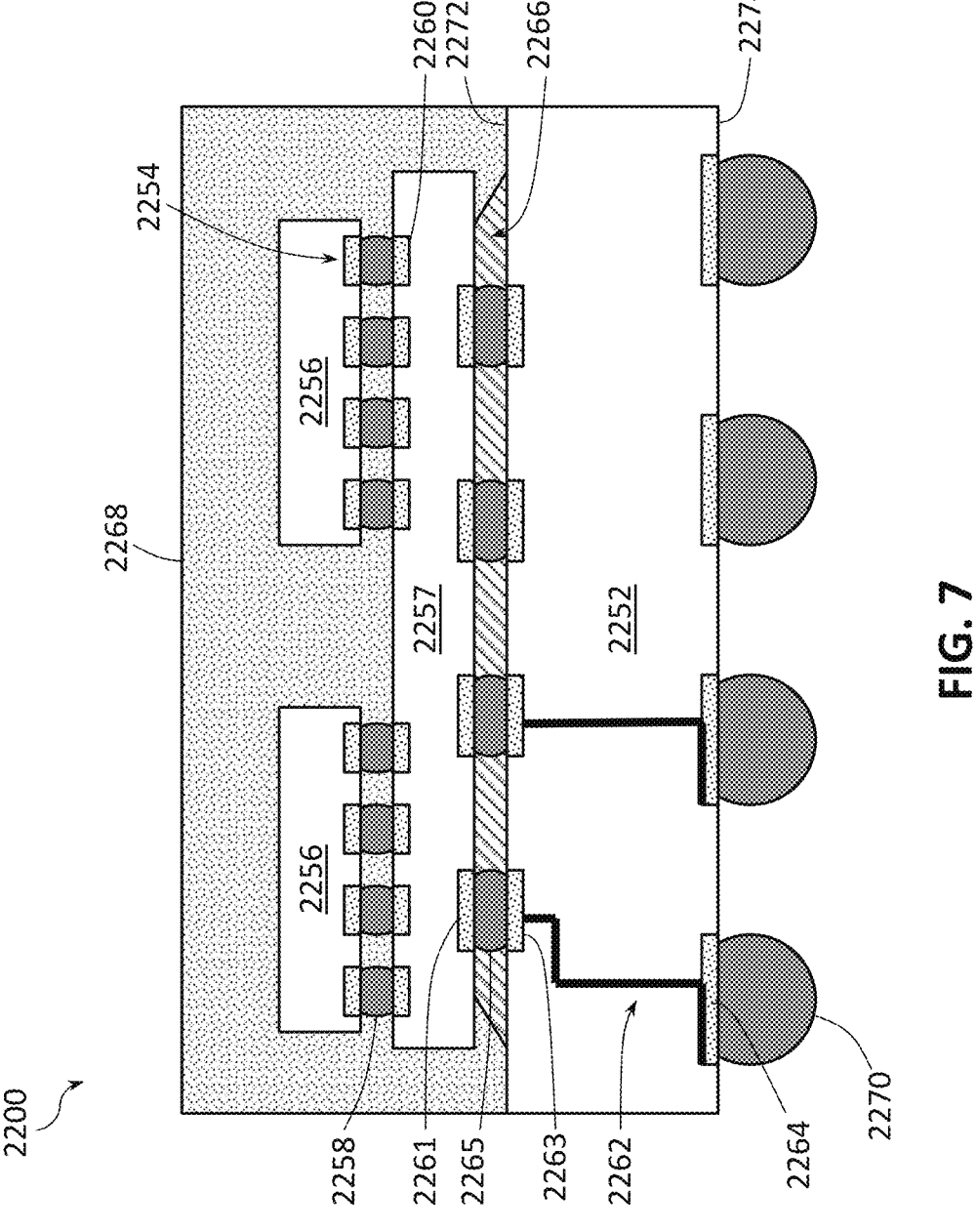
FIG. 7 is a cross-sectional side view of an IC package that may include one or more 3D folded SRAM cells in accordance with any of the embodiments disclosed herein.

FIG. 7 is a side, cross-sectional view of an example IC package 2200 that may include one or more 3D folded SRAM cells in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein (e.g., may include any of the embodiments of the 3D folded SRAM cells as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more 3D folded SRAM cells, e.g., as discussed above; in some embodiments, at least some of the dies 2256 may not include any 3D folded SRAM cells.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

US 12,575,076 B2

Figure 8:
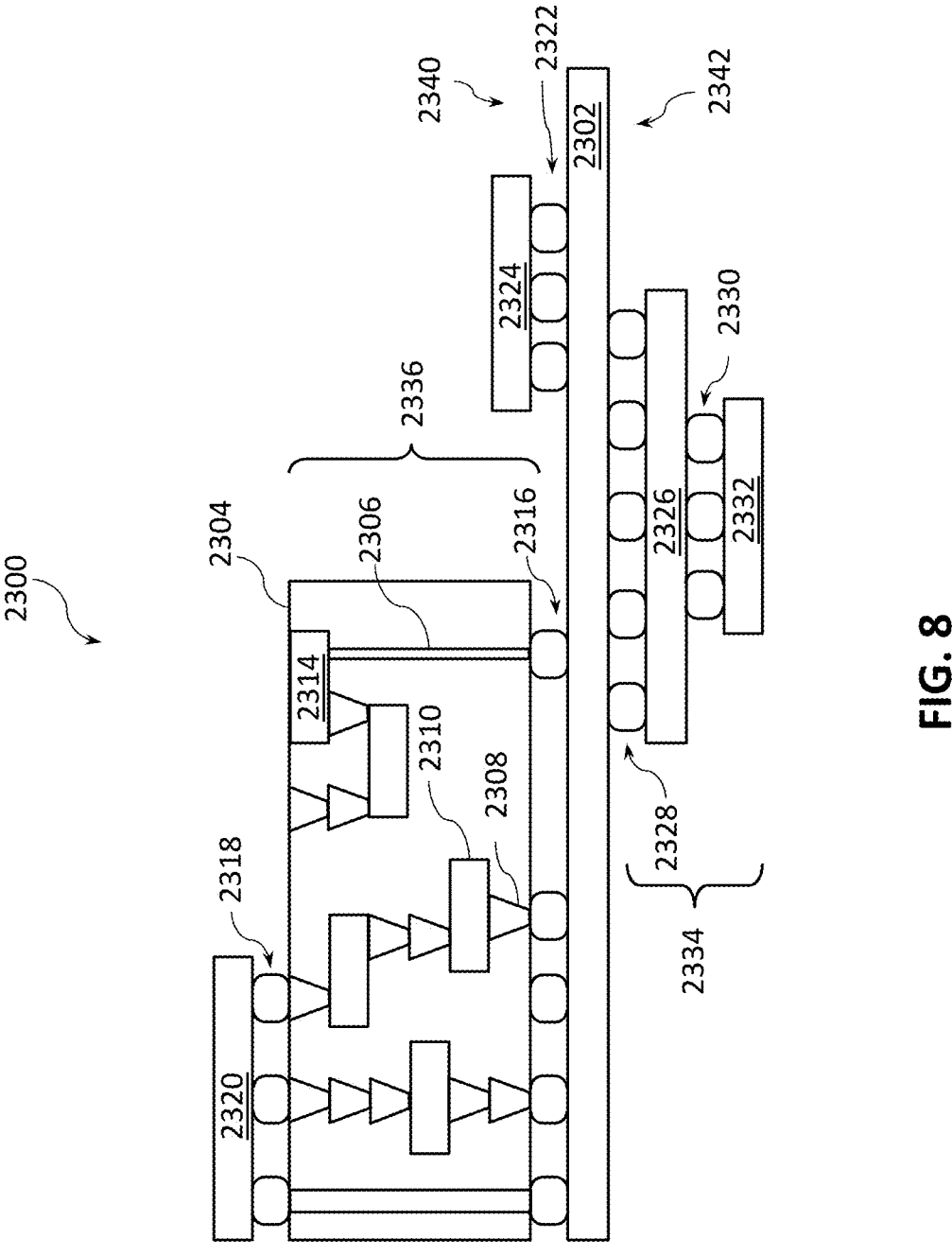
FIG. 8 is a cross-sectional side view of an IC device assembly that may include one or more 3D folded SRAM cells in accordance with any of the embodiments disclosed herein.

FIG. 8 is a cross-sectional side view of an IC device assembly 2300 that may include components having one or more 3D folded SRAM cells in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more 3D memory arrays with 3D folded SRAM cells in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more 3D folded SRAM cells provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6), an IC device, or any other suitable component. In particular, the IC package 2320 may include one or more 3D folded SRAM cells as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
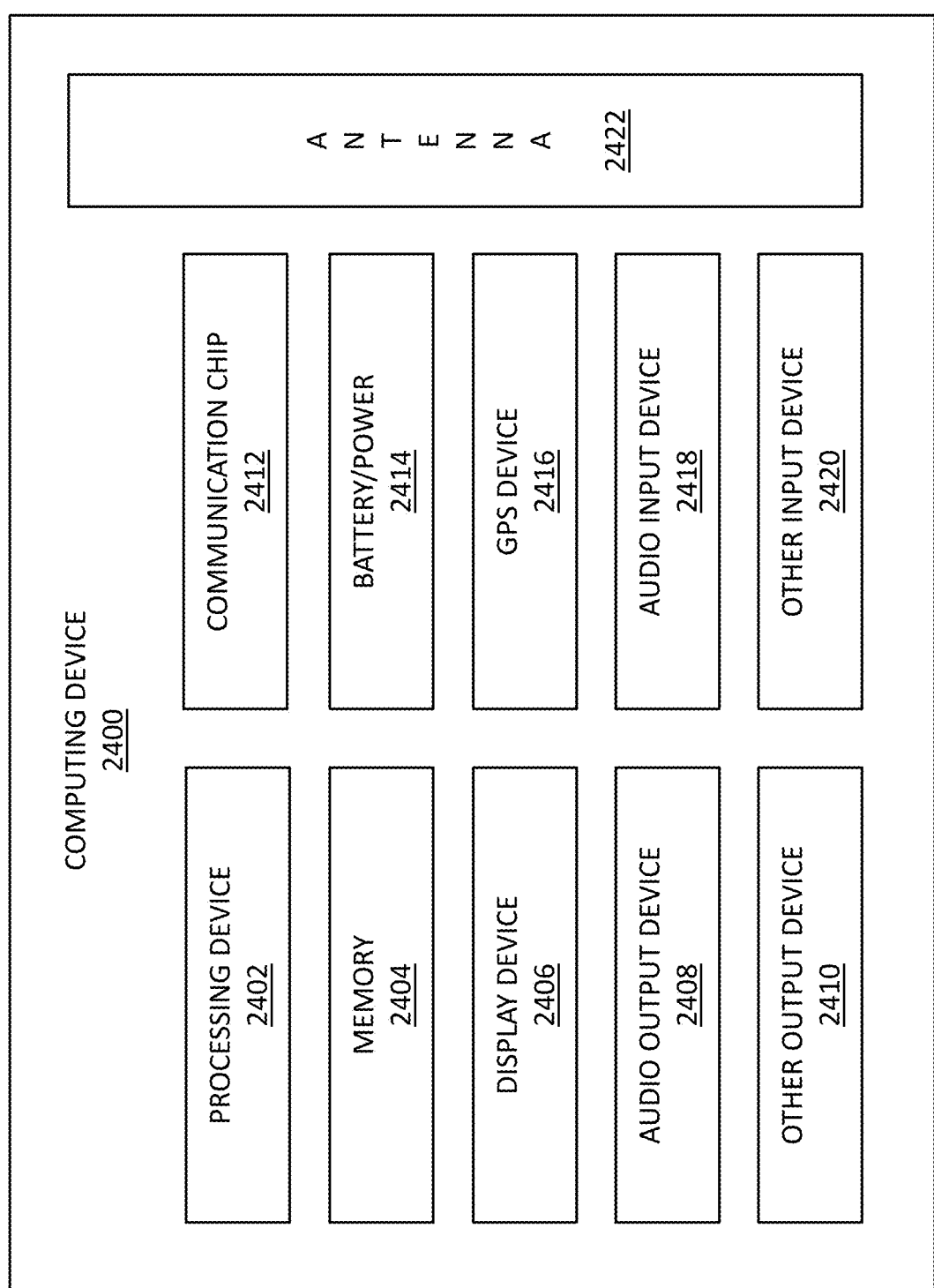
FIG. 9 is a block diagram of an example computing device that may include one or more 3D folded SRAM cells in accordance with any of the embodiments disclosed herein.

FIG. 9 is a block diagram of an example computing device 2400 that may include one or more components with one or more 3D folded SRAM cells in accordance with any of the embodiments disclosed herein. For example, any suitable ones of the components of the computing device 2400 may include a die (e.g., the die 2002 (FIG. 6)) including one or more 3D arrays of 3D folded SRAM cells in accordance with any of the embodiments disclosed herein. Any of the components of the computing device 2400 may include an IC package 2200 (FIG. 7). Any of the components of the computing device 2400 may include an IC device assembly 2300 (FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include eSRAM, e.g., a 3D array of 3D folded SRAM cells as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device that includes a support structure (e.g., a substrate, a die, a wafer, or a chip); a first semiconductor structure and a second semiconductor structure (separated from the first semiconductor structure by an insulator material) in a first layer over the support structure; a third semiconductor structure and a fourth semiconductor structure (separated from the third semiconductor structure by an insulator material) in a second layer over the support structure, where the second layer is either above the first layer or below the first layer; and a memory cell including a plurality of transistors, where the plurality of transistors includes a transistor M1, a transistor M2, a transistor M3, a transistor M4, a transistor M5, and a transistor M6, where a channel portion of the transistor M2 is a portion of the first semiconductor structure, a channel portion of the transistor M4 is a portion of the second semiconductor structure, channel portions of the transistor M1 and the transistor M5 are different portions of the third semiconductor structure, channel portions of the transistor M6 and the transistor M3 are different portions of the fourth semiconductor structure, and an S/D region of the transistor M6 is electrically connected with an S/D region of the transistor M4, a gate stack of the transistor M1, and a gate stack of the transistor M2.

Example 2 provides the IC device according to example 1, where a projection of the third semiconductor structure onto the support structure at least partially overlaps with a projection of the first semiconductor structure onto the support structure, and the IC device further includes a conductor extending between the S/D region of the transistor M6 and the S/D region of the transistor M4.

Example 3 provides the IC device according to example 2, where the conductor is substantially perpendicular to the support structure.

Example 4 provides the IC device according to examples 2 or 3, where a projection of a gate of the transistor M3 onto the support structure is closer to a projection of a gate of the transistor M4 onto the support structure than a projection of a gate of the transistor M6 onto the support structure.

Example 5 provides the IC device according to example 4, where the conductor is a first conductor, and the IC device further includes a second conductor, where one portion of the first conductor is the gate of the transistor M3, and another portion of the conductor is the gate of the transistor M4.

Example 6 provides the IC device according to example 5, where the second conductor is substantially perpendicular to the support structure.

Example 7 provides an IC device that includes a support structure (e.g., a substrate, a die, a wafer, or a chip); first and second fins, or, more generally, elongated semiconductor structures, separated one another by an insulator material, over the support structure; a first structure stacked above the first fin and including a first thin film semiconductor; a second structure stacked above the second fin and including a second thin film semiconductor; an SRAM cell including transistors M1, M2, M3, M4, M5, and M6, where channel portions of the transistors M1 and M5 are in different portions of the first structure, channel portions of the transistors M6 and M3 are in different portions of the second structure, a channel portion of the transistor M2 is in a portion of the first fin, and a channel portion of the transistor M4 is in a portion of the second fin; and a materially continuous conductive (electrically conductive) structure substantially perpendicular to the support structure, where a bottom end of the conductive structure (i.e., the end closest to the support structure) is a gate electrode of the transistor M2 and a top end of the conductive structure (i.e., the end farthest away from the support structure) is a gate electrode of the transistor M1.

Example 8 provides the IC device according to example 7, where the conductive structure is a first conductive structure, and the IC device further includes a materially continuous second conductive (electrically conductive) structure substantially perpendicular to the support structure, where a bottom end of the second conductive structure is a gate electrode of the transistor M4 and a top end of the conductive structure is a gate electrode of the transistor M3.

Example 9 provides the IC device according to examples 7 or 8, where the conductive structure is a first conductive structure, and the IC device further includes a materially continuous second conductive (electrically conductive) structure substantially perpendicular to the support structure, where a bottom end of the second conductive structure is a source or drain electrode of the transistor M2 and a top end of the conductive structure is a source or drain electrode of the transistor M1.

Example 10 provides the IC device according to any one of examples 7-9, where the conductive structure is coupled to an S/D region of the transistor M3 (e.g., has a first portion that forms an S/D contact of the transistor M3) and an S/D region of the transistor M4 (e.g., has a second portion that forms an S/D contact of the transistor M4).

Example 11 provides the IC device according to any one of examples 7-10, where each of the transistors M1 and M3 has first and second S/D region electrodes, one of the first and second S/D region electrodes is a source electrode, another one of the first and second S/D region electrodes is a drain electrode, the first S/D region electrode of the transistor M1 is closer to the support structure than the channel portion of the transistor M1, the second S/D region electrode of the transistor M1 is further away from the support structure than the channel portion of the transistor M1, the first S/D region electrode of the transistor M3 is closer to the support structure than the channel portion of the transistor M3, and the second S/D region electrode of the transistor M3 is further away from the support structure than the channel portion of the transistor M3.

Example 12 provides the IC device according to any one of examples 7-11, where each of the transistors M1 and M3 is a bottom-gated transistor.

Example 13 provides the IC device according to any one of examples 7-12, where a pitch of the first fin and the second fin is between about 10 nanometers and 100 nanometers.

Example 14 provides the IC device according to any one of examples 7-13, where a width of the first structure is between about 10 nanometers and 100 nanometers, and a length of the first structure is larger than the width of the first structure.

Example 15 provides an IC device that includes a support structure (e.g., a substrate, a die, a wafer, or a chip); first and second layers over the support structure, where either the first layer is between the support structure and the second layer, or the second layer is between the support structure and the first layer; and an SRAM cell including six transistors, where two transistors of the six transistors have channel portions in the first layer and four transistors of the six transistors have channel portions in the second layer.

Example 16 provides the IC device according to example 15, where the two transistors are transistors of a first type, and the four transistors are transistors of a second type, where one of the first type and the second type is an N-type and another one of the first type and the second type is a P-type.

Example 17 provides the IC device according to examples 15 or 16, where the channel portion of a first transistor of the four transistors and the channel portion of a second transistor of the four transistors are different portions of a materially continuous semiconductor structure in the second layer.

Example 18 provides the IC device according to example 17, where a first S/D region of the first transistor is coupled to, or shared with, a first S/D region of the second transistor, and a second S/D region of the first transistor is coupled to a reference voltage port and a second S/D region of the second transistor is coupled to a bitline.

Example 19 provides the IC device according to example 18, where the first S/D region of the first transistor is coupled to a first S/D region of one of the two transistors, a second S/D region of the one of the two transistors is coupled to a further reference voltage, the channel portion of the one of the two transistors is a portion of a first semiconductor structure in the first layer, and the channel portion of another one of the two transistors is a portion of a second semiconductor structure in the first layer.

Example 20 provides the IC device according to example 19, where a projection of the materially continuous semiconductor structure in the second layer onto the support structure at least partially overlaps with a projection of the first semiconductor structure onto the support structure.

Example 21 provides an IC device that includes a support structure (e.g., a substrate, a die, a wafer, or a chip); a first thin film semiconductor structure over the support structure; a second thin film semiconductor structure over the support structure; and a memory cell including a plurality of transistors, where the plurality of transistors includes a transistor M1, a transistor M2, a transistor M3, a transistor M4, a transistor M5, and a transistor M6, transistor M2 and transistor M4 are P-type transistors and have channel portions in a first layer over the support structure, transistor M1, transistor M3, transistor M5, and transistor M6 are N-type transistors and have channel portions in a second layer over the support structure, where the first layer is between the support structure and the second layer, the channel portion of transistor M1 and the channel portion of transistor M5 are in different portions of the first thin film semiconductor structure, and the channel portion of transistor M3 and the channel portion of transistor M6 are in different portions of the second thin film semiconductor structure.

Example 22 provides an IC package that includes an IC die, including one or more of the IC devices according to any one of the preceding examples. The IC package may also include a further component, coupled to the IC die.

Example 23 provides the IC package according to example 22, where the further component is one of a package substrate, a flexible substrate, or an interposer.

Example 24 provides the IC package according to examples 22 or 23, where the further component is coupled to the IC die via one or more first-level interconnects. For example, one or more first-level interconnects may include one or more solder bumps, solder posts, or bond wires.

Example 25 provides a computing device that includes a circuit board; and an IC die coupled to the circuit board, where the IC die includes one or more of the IC devices according to any one of the preceding examples (e.g., IC devices according to any one of examples 1-21), and/or the IC die is included in the IC package according to any one of the preceding examples (e.g., the IC package according to any one of examples 22-24).

Example 26 provides the computing device according to example 25, where the computing device is a wearable computing device (e.g., a smart watch) or handheld computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a base;
first and second semiconductor structures in a first layer over the base;
third and fourth semiconductor structures in a second layer over the base, wherein the second layer is either above the first layer or below the first layer; and
a memory cell comprising a plurality of transistors, wherein the plurality of transistors includes a transistor M1, a transistor M2, a transistor M3, a transistor M4, a transistor M5, and a transistor M6, wherein a channel portion of the transistor M2 is a portion of the first semiconductor structure, a channel portion of the transistor M4 is a portion of the second semiconductor structure, channel portions of the transistor M1 and the transistor M5 are different portions of the third semiconductor structure, and channel portions of the transistor M6 and the transistor M3 are different portions of the fourth semiconductor structure.

2. The IC device according to claim 1, wherein:
a projection of the third semiconductor structure onto the base at least partially overlaps with a projection of the first semiconductor structure onto the base, and the IC device further includes a conductor extending between a region of the transistor M6 and a region of the transistor M4, the region of the transistor M6 is either a source region of the transistor M6 or a drain region of the transistor M6, and the region of the transistor M4 is either a source region of the transistor M4 or a drain region of the transistor M4.

3. The IC device according to claim 2, wherein the conductor is substantially perpendicular to the base.

4. The IC device according to claim 2, wherein a projection of a gate of the transistor M3 onto the base is closer to a projection of a gate of the transistor M4 onto the base than a projection of a gate of the transistor M6 onto the base.

5. The IC device according to claim 4, wherein the conductor is a first conductor, and the IC device further includes a second conductor, wherein one portion of the first conductor is the gate of the transistor M3, and another portion of the conductor is the gate of the transistor M4.

6. The IC device according to claim 5, wherein the second conductor is substantially perpendicular to the base.

7. The IC device according to claim 1, wherein:

a region of the transistor M6 is conductively coupled with a region of the transistor M4, a gate stack of the transistor M1, and a gate stack of the transistor M2, the region of the transistor M6 is either a source region of the transistor M6 or a drain region of the transistor M6, and the region of the transistor M4 is either a source region of the transistor M4 or a drain region of the transistor M4.

8. The IC device according to claim 1, wherein the memory cell is a static random-access memory (SRAM) cell.

9. An integrated circuit (IC) device, comprising:

a substrate;

first and second fins over the substrate;

a first structure stacked above the first fin and comprising a first thin film semiconductor;

a second structure stacked above the second fin and comprising a second thin film semiconductor; and a static random-access memory (SRAM) cell comprising transistors M1, M2, M3, M4, M5, and M6, wherein channel portions of the transistors M1 and M5 are in different portions of the first structure, channel portions of the transistors M6 and M3 are in different portions of the second structure, a channel portion of the transistor M2 is in a portion of the first fin, and a channel portion of the transistor M4 is in a portion of the second fin.

10. The IC device according to claim 9, wherein:

each of the transistors M1 and M3 has first and second electrodes, one of the first and second electrodes is a source electrode, another one of the first and second electrodes is a drain electrode, the first electrode of the transistor M1 is closer to the substrate than the channel portion of the transistor M1, the second electrode of the transistor M1 is further away from the substrate than the channel portion of the transistor M1, the first electrode of the transistor M3 is closer to the substrate than the channel portion of the transistor M3, and the second electrode of the transistor M3 is further away from the substrate than the channel portion of the transistor M3.

11. The IC device according to claim 9, wherein each of the transistors M1 and M3 is a bottom-gated transistor.

12. The IC device according to claim 9, further comprising:

a conductive structure, wherein a bottom end of the conductive structure is a gate electrode of the transistor M2, and a top end of the conductive structure is a gate electrode of the transistor M1.

13. The IC device according to claim 12, wherein the conductive structure is a first conductive structure, the IC device further includes a second conductive structure, a bottom end of the second conductive structure is a gate electrode of the transistor M4, and a top end of the conductive structure is a gate electrode of the transistor M3.

14. The IC device according to claim 12, wherein the conductive structure is a first conductive structure, the IC device further includes a second conductive structure, and a bottom end of the second conductive structure is a source electrode or a drain electrode of the transistor M2 and a top end of the conductive structure is a source electrode or a drain electrode of the transistor M1.

15. The IC device according to claim 12, wherein the conductive structure is coupled to a region of the transistor M3 and a region of the transistor M4, the region of the transistor M3 is either a source region of the transistor M3 or a drain region of the transistor M3, and the region of the transistor M4 is either a source region of the transistor M4 or a drain region of the transistor M4.

16. The IC device according to claim 12, wherein the conductive structure is substantially perpendicular to the substrate.

17. The IC device according to claim 9, wherein a pitch of the first fin and the second fin is between about 10 nanometers and 100 nanometers.

18. The IC device according to claim 9, wherein a width of the first structure is between about 10 nanometers and 100 nanometers, and a length of the first structure is larger than the width of the first structure.

19. An integrated circuit (IC) device, comprising:

a die;

first and second layers over the die, wherein either the first layer is between the die and the second layer, or the second layer is between the die and the first layer; and a memory cell comprising six transistors, wherein two transistors of the six transistors have channel portions in the first layer, four transistors of the six transistors have channel portions in the second layer, and the channel portion of a first transistor of the four transistors and the channel portion of a second transistor of the four transistors are different portions of a materially continuous semiconductor structure in the second layer.

20. The IC device according to claim 19, wherein the two transistors are transistors of a first type, and the four transistors are transistors of a second type, wherein one of the first type and the second type is an N-type and another one of the first type and the second type is a P-type.

21. The IC device according to claim 19, wherein:

a first region of the first transistor is coupled to, or shared with, a first region of the second transistor, a second region of the first transistor is coupled to a reference voltage port and a second region of the second transistor is coupled to a bitline, the first region of the first transistor is one of a source region or a drain region of the first transistor, the second region of the first transistor is another one of the source region or the drain region of the first transistor, the first region of the second transistor is one of a source region or a drain region of the second transistor, and the second region of the second transistor is another one of the source region or the drain region of the second transistor.

22. The IC device according to claim 21, wherein:

the first region of the first transistor is coupled to a first region of one of the two transistors, a second region of the one of the two transistors is coupled to an additional reference voltage, the first region of the one of the two transistors is one of a source region or a drain region of the one of the two transistors, the second region of the one of the two transistors is another one of the source region or the drain region of the one of the two transistors, the channel portion of the one of the two transistors is a portion of a first semiconductor structure in the first layer, and the channel portion of another one of the two transistors is a portion of a second semiconductor structure in the first layer.

23. The IC device according to claim 22, wherein a projection of the materially continuous semiconductor structure in the second layer onto the die at least partially overlaps with a projection of the first semiconductor structure onto the die.

24. The IC device according to claim 19, wherein the memory cell is a static random-access memory (SRAM) cell.

* * * * *